US006958907B2

(12) United States Patent
Sato et al.

(10) Patent No.: US 6,958,907 B2
(45) Date of Patent: Oct. 25, 2005

(54) OPTICAL DATA LINK

(75) Inventors: Shunsuke Sato, Yokohama (JP);
Ryugen Yonemura, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 188 days.

(21) Appl. No.: 10/647,127

(22) Filed: Aug. 25, 2003

(65) Prior Publication Data
US 2004/0062491 A1 Apr. 1, 2004

(30) Foreign Application Priority Data
Aug. 23, 2002 (JP) .......................... P2002-244035

(51) Int. Cl.[7] .............................................. H05K 7/20
(52) U.S. Cl. ..................... 361/690; 359/88; 359/820; 361/704; 361/708; 361/710; 361/715; 361/719; 361/720; 385/92; 398/135; 398/138; 165/80.3; 165/185
(58) Field of Search ................ 165/80.3, 185; 174/16.3; 359/88, 820; 361/690, 704, 707–710, 361/715, 719–721; 385/88–96; 398/135, 398/138–139

(56) References Cited
U.S. PATENT DOCUMENTS

| | | | |
|---|---|---|---|
| 5,280,191 A * | 1/1994 | Chang | 257/712 |
| 5,930,430 A * | 7/1999 | Pan et al. | 385/94 |
| 6,508,595 B1 * | 1/2003 | Chan et al. | 385/92 |
| 6,663,294 B2 * | 12/2003 | Crane et al. | 385/92 |
| 6,788,540 B2 * | 9/2004 | Kruger et al. | 361/719 |
| 6,816,376 B2 * | 11/2004 | Bright et al. | 361/704 |
| 6,856,769 B1 * | 2/2005 | Steffensen et al. | 398/135 |
| 2002/0126456 A1 | 9/2002 | Sato et al. | |
| 2003/0091349 A1 | 5/2003 | Sato et al. | |

* cited by examiner

Primary Examiner—Gregory Thompson
(74) Attorney, Agent, or Firm—McDermott Will & Emery LLP

(57) ABSTRACT

An optical data link comprises a housing, a circuit board, a semiconductor electrical device, an electrically insulating sealing resin, an optical subassembly, a first heat spreader, and a second heat spreader. The circuit board is provided in the housing. The semiconductor electrical device is provided on the circuit board. The electrically insulating sealing resin covers the semiconductor electrical device. The optical subassembly is supported by the housing. The optical subassembly includes a semiconductor optical device. The semiconductor optical device is connected to the semiconductor electrical device through the circuit board. The first heat spreader is provided between the housing and the semiconductor electrical device and is in contact with the housing. The second heat spreader is provided between the housing and the optical subassembly and is in contact with the housing and the optical subassembly. The second heat spreader is located apart from the first heat spreader.

20 Claims, 22 Drawing Sheets

OPTICAL DATA LINK

BACKGROUND OF THE INVENTION

1. Field of the Invention

The present invention relates to an optical data link.

2. Related Background of the Invention

An optical data link includes a photoelectric conversion unit, a metal housing base member, a board directly fixed to the base member, and a cover for covering the board. FIGS. 25A, 25B, 26A, and 26B are views showing an optical data link. In the optical data link 9, a circuit board 4 and a photoelectric conversion unit 6 are mounted on a metal housing base member 2. Lead terminals 7 are supported by the metal housing base member 2, and are arranged in the circuit board 4. The circuit board 4 is covered with a cover 8 attached to the metal housing base member 2.

With reference to FIG. 26A, the circuit board 4 is directly mounted on the housing base member 2 in the optical data link 9. Silver paste is applied on the back side of the circuit board 4 so that the circuit board 4 is bonded on the housing base member 2. Since the silver paste is applied to the entire back side of the circuit board 4 to bond it to the base member 2, electronic parts can be mounted only on the front side of the circuit board 4. Accordingly, a larger board is used to increase the area for mounting the electronic components.

Referring to FIG. 26B, the housing base member 2 is made of a plurality of parts in the optical data link 9, such as parts 2a and 2c made of Kovar, and a part 2b made of copper tungsten (CuW). Since these parts 2a, 2b and 2c are assembled using silver soldering and the optical data link 9 is formed from a large number of components, the assembly is complicated. Due to the large number of components and the complexity in the structure, it is not easy to develop optical data links of a miniature size.

SUMMARY OF THE INVENTION

If a greater number of electronic parts are mounted, a large amount of heat is generated in these electronic parts and the generated heat has to be dissipated to the outside of the optical data link. In the conventional optical data link, the heat is dissipated by air-cooling. Further, in order to attain large-capacity optical communications, the optical data link is required to operate in high speed. The generated heat can be conducted effectively through a heat spreader having a high thermal conductivity provided between the housing of the optical data link and the electronic parts that generate heat.

The electronic parts, such as a semiconductor electronic device, and an optical subassembly both generate heat. In the optical data link using a single heat spreader, there is a possibility to deteriorate the performance of optical data link. Heat from the electronic part that consumes a relatively greater power is transferred to the other electronic part that consumes a relatively smaller power, so that the temperature of the other electronic part is increased, which affects performance of the electronic parts. Accordingly, it is necessary to reduce the occurrence of thermal interference in heat dissipation between the electronic parts.

According to one aspect of the present invention, an optical data link comprises a housing, a circuit board, a semiconductor electrical device, an electrically insulative member, an optical subassembly, a first heat spreader, and a second heat spreader. The circuit board is provided in the housing. The semiconductor electrical device is provided on the circuit board. The electrically insulative member is provided for covering the semiconductor electrical device. The optical subassembly is supported by the housing. The optical subassembly includes a semiconductor optical device. The semiconductor optical device is connected to the semiconductor electrical device through the circuit board. The first heat spreader is provided between the housing and the semiconductor electrical device. The first heat spreader is in contact with the housing. The second heat spreader is provided between the housing and the optical subassembly. The second heat spreader is in contact with the housing and the optical subassembly. The second heat spreader is located apart from the first heat spreader.

The semiconductor electrical device may be provided between the circuit board and the cover. The first heat spreader is provided between the circuit board and the cover so as to be in contact with the cover and the insulative member. The second heat spreader is provided between the optical subassembly and the cover so as to be in contact with the cover.

The semiconductor electrical device may be provided between the circuit board and the base. The circuit board has a thermal via provided in a predetermined region thereof and the semiconductor electrical device is mounted on the predetermined region. The first heat spreader is provided between the circuit board and the cover so as to be in contact with the cover and the thermal via.

The semiconductor electrical device may be provided between the circuit board and the cover. The first heat spreader is provided between the circuit board and the cover so as to be in contact with the cover and the insulative member. The second heat spreader is provided between the optical subassembly and the base so as to be in contact with the base.

The semiconductor electrical device may be provided between the circuit board and the base. The first heat spreader is provided between the circuit board and the base so as to be in contact with the base and the insulative member. The second heat spreader is provided between the optical subassembly and the cover so as to be in contact with the cover.

The semiconductor electrical device may be provided between the circuit board and the base. The first heat spreader is provided between the circuit board and the base so as to be in contact with the base and the insulative member. The second heat spreader is provided between the optical subassembly and the base so as to be in contact with the base.

In the optical data link of the present invention, the first heat spreader is in contact with a first region of the cover. The second heat spreader is in contact with a second region of the cover. The cover may have an opening provided between the first and second regions.

The base and the cover provide a cavity and the circuit board is provided in the cavity. The cover may have first and second fingers. The first finger is bent into the cavity so as to be in contact with the first heat spreader, and the second finger is bent into the cavity so as to be in contact with the second heat spreader.

The cover may have a side wall and a lid. The first and second fingers are provided in at least one of the side wall and the lid.

The cover may have an opening provided between the first and second fingers.

The base supports a plurality of lead terminals. The circuit board may make an angle from 10 degrees to 80 degrees with respect to the base.

According to another feature of the present invention, the optical data link further comprises another optical subassembly, another circuit board, and an electronic component. The other optical subassembly is provided in the housing. The other circuit board is provided in the housing. The electronic component is mounted on the other circuit board. The electronic component is electrically connected to the other optical subassembly. The cover has a third finger bent into the cavity for transferring heat from the second circuit board. The cover has an opening provided between the first and third fingers.

In the optical data link, the circuit board includes a conductive pattern provided on a primary surface thereof. The conductive pattern is connected to the semiconductor electrical device. The first heat spreader contacts with the conductive pattern.

The optical data link may further comprise a connection board and a flexible printed board. The connection board is connected with the optical subassembly. The flexible printed board connects the circuit board with the connection board. The optical subassembly has a lead terminal connected to the connection board.

In the optical data link, the first and second heat spreaders are an electrically insulative.

At least one of the first and second heat spreaders have elasticity sufficient to deform in accordance with the shapes of the cover and optical subassembly.

At least one of the first and second heat spreaders may be a silicone gel.

In the optical data link, the semiconductor optical device contains a semiconductor light-emitting device driven by the semiconductor electrical device.

The first and second heat spreaders are made of material having a thermal conductivity of 0.5 to 50 W/m/K.

The first and second heat transfer are made of material having hardness of 10 to 100 under the ASKER-C defined in the Society of Rubber Institute Standard (SRIS) 0101.

BRIEF DESCRIPTION OF THE DRAWINGS

The above-described object and other objects, features, and advantages of the present invention will become apparent more easily in the detailed description of the preferred embodiments of the present invention which will be described below with reference to the accompanying drawings.

DESCRIPTION OF THE PREFERRED EMBODIMENTS

An optical data link according to the embodiments of the present invention will be described with reference to the drawings. When possible, parts identical to each other will be referred to with numerals identical to each other.

(First Embodiment)

Figure 1:
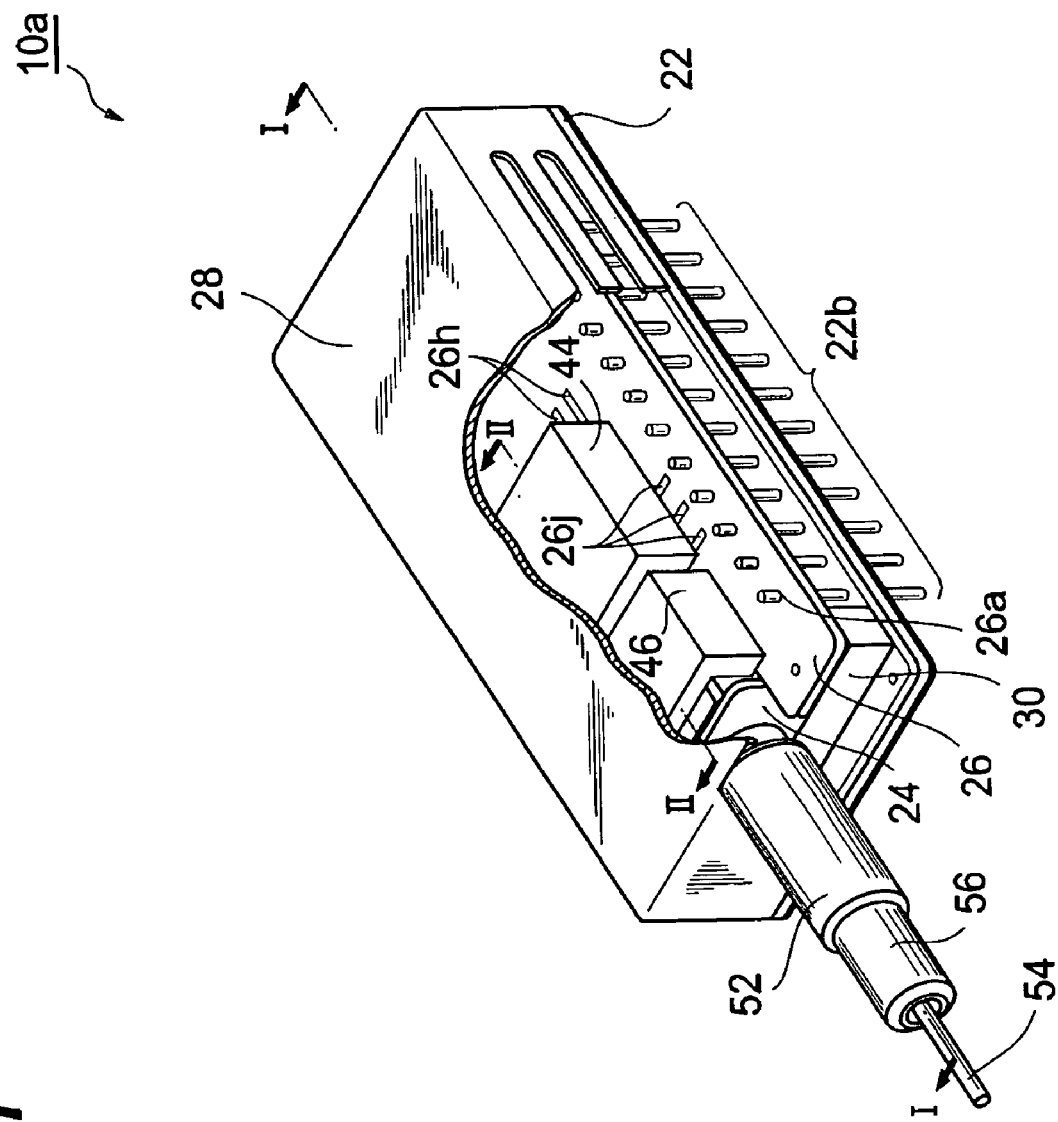
FIG. 1 is a view showing an optical data link according to a first embodiment of the present invention.
Figure 2:
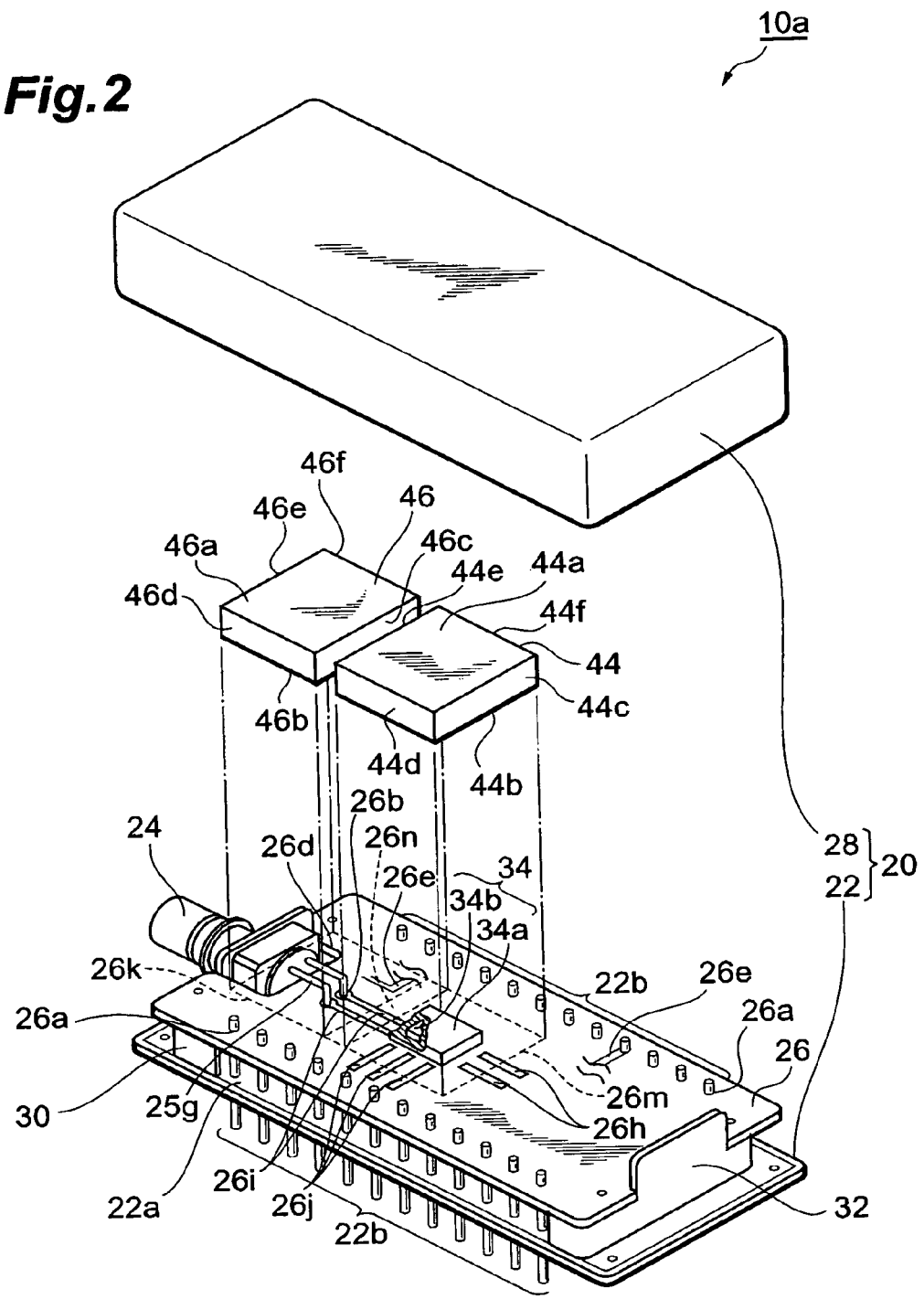
FIG. 2 is a view of components of the optical data link according to the first embodiment.

FIG. 1 is a view of the internal structure of the optical data link according to this embodiment, and FIG. 2 is a perspective view of the components of the optical data link according to the present embodiment. In FIGS. 1 and 2, the optical data link 10a includes a housing 20, an optical subassembly 24, a circuit board 26, a first heat spreader 44 and a second heat spreader 46. A semiconductor device 34b is provided on the circuit board 26 with a protection member 34a, such as molded resin or a package. The first heat spreader 44 is provided between the housing 20 and the semiconductor device 34b, and contacts with the housing 20 and the semiconductor device 34b. The second heat spreader 46 is provided between the housing 20 and the optical subassembly 24, and contacts with the housing 20 and the optical subassembly 24. There is an interval between the first heat spreader 44 and the second heat spreader 46. The first heat spreader 44 is provided in a first region 26m, and the second heat spreader part 46 is provided in a second region 26k. The third region 26n serves to space the first heat spreader 44 from the second heat spreader 46. The optical subassembly 24 is supported by the housing 20 and includes a semiconductor optical device, which is connected to the semiconductor device 34b through a conductive pattern 26i on the circuit board 26.

Heat from the semiconductor device 34b is conducted to the first heat spreader 44, and heat from the optical subassembly 24 is conducted to the second heat spreader 46. Since the first heat spreader 44 is located apart from the second heat spreader 46, thermal interference between the semiconductor device 34b and the optical subassembly 24 can be reduced.

The housing 20 includes a base 22 and a cover 28. The circuit board 26 is provided between the base 22 and the cover 28 made of a conductive material. The optical subassembly 24 is provided on the primary surface of the base 22. The circuit board 26 is mounted on the base 22 so as to provide a room sufficient to place one or more electronic parts between the circuit board 26 and the base 22.

Referring to FIG. 1, a sleeve 52 is placed at a tip of the optical subassembly 24. The sleeve 52 guides a ferrule 56 attached to an optical fiber 54, whereby the optical fiber 54 can be optically coupled to the optical subassembly 24.

The optical subassembly 24 is supported by a first spacer 30 provided on the primary surface of the base 22. The first spacer 30 positions the optical subassembly 24 on the base 22 so as to direct it toward a predetermined direction. The circuit board 26 is supported by a second spacer 32. The second spacer 32 is located on the primary surface of the base 22 so as to provide space sufficient to place one or more electronic parts between the circuit board 26 and the primary surface of the base 22.

Figure 3:
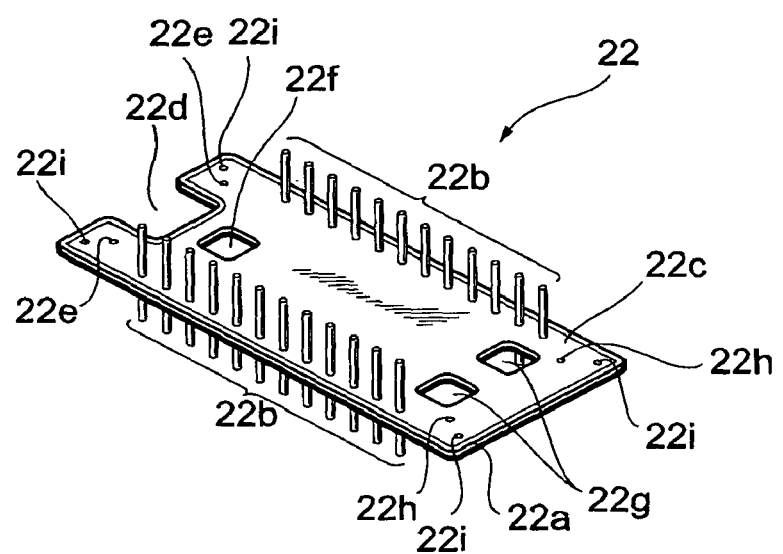
FIG. 3 is a view showing a base for the optical data link.

FIG. 3 is a perspective view of the base. A pin grid array (PGA) board can be used as the base 22. The base 22 has a board 22a and a plurality of conductive pins 22b. The board 22a has a plurality of holes through which the conductive pins 22b pass. The conductive pins 22b are arrayed parallel to the predetermined direction along both side of the base 22.

A conductive pattern 22c is provided on almost all the primary surface of the board 22a. The conductive pattern 22c is connected to one of the conductive pins 22b so that the conductive pattern 22c is connected to a reference potential. The board 22a has, on one side thereof, a positioning hole 22e which determines a position of the first spacer 30. In addition, the board 22a has an opening 22d, provided in one side thereof, to receive the tail of the optical subassembly 24 therein.

Figure 4:
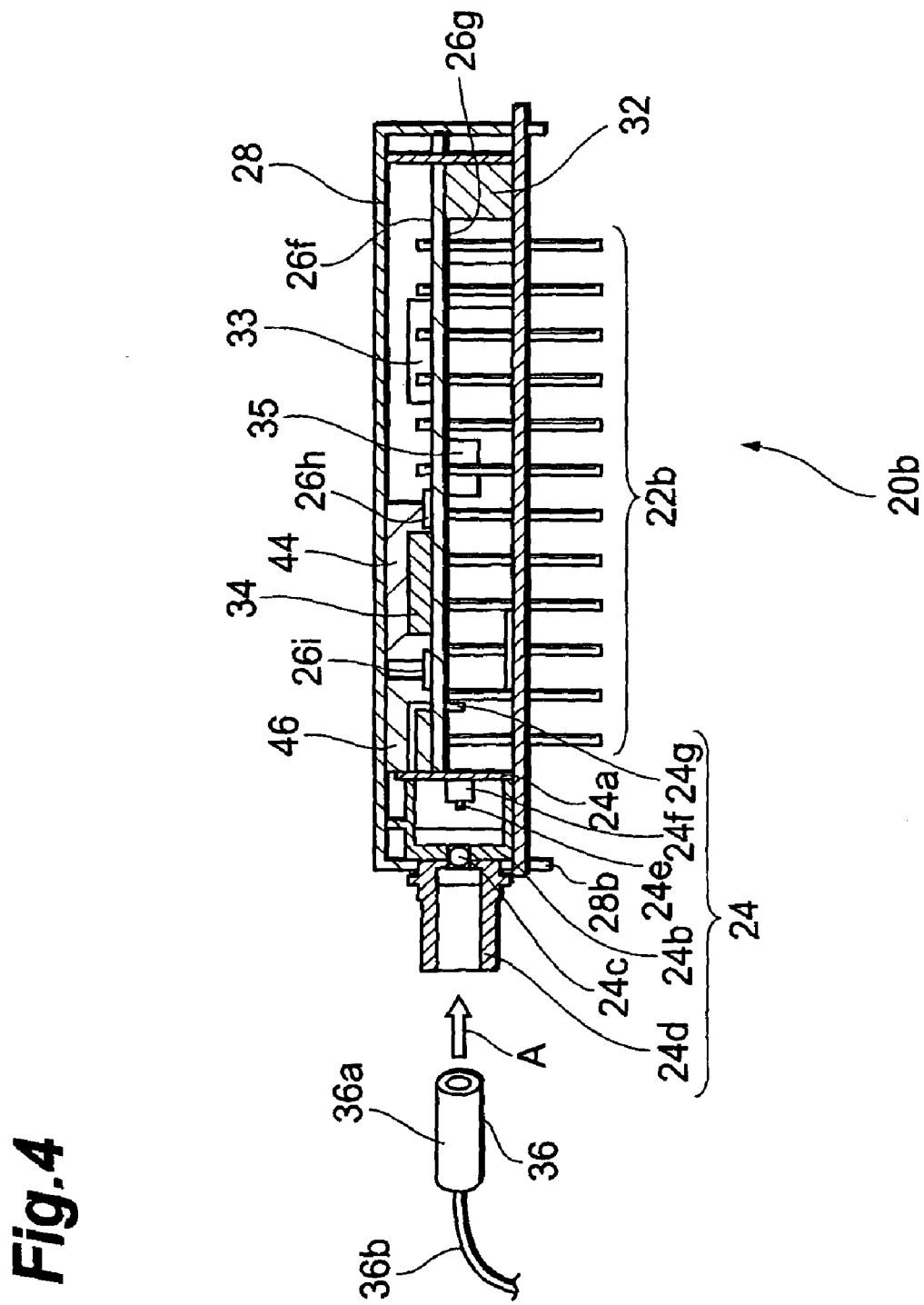
FIG. 4 is a cross sectional view showing the optical data link shown in FIG. 2.

FIG. 4 is a sectional view showing the optical data link 10a taken along the line I—I of FIG. 1. The optical subassembly 24 includes a stem 24a for mounting an optical device, a lens holder 24b, a lens 24c held by the lens holder 24b and the sleeve 24d. The stem 24a, lens holder 24b, lens 24c and sleeve 24d are arranged along the predetermined direction. One end of the lens holder 24b is placed on the positioning surface of the stem 24a. The sleeve 24 displaced on the other end of the lens holder 24b. When an optical connector is coupled to the optical data link, the optical connector is inserted into the sleeve 24d. A chip carrier 24f for mounting a semiconductor optical device 24e is placed on the surface of the stem 24a. The semiconductor optical device 24e is provided on the chip carrier 24f such that the semiconductor optical device 24e is aligned with an optical axis of the optical data link 10a. The semiconductor optical device 24e is electrically connected to a pin 24g provided in the stem 24a.

When the semiconductor optical device 24e may be a laser diode, the optical data link 10a works as an optical transmitter. When the semiconductor optical device 24e may be a photodiode, the optical data link 10a works as an optical receiver. The optical connecter 36 is inserted into the sleeve 24d in the direction of the arrow "A." The optical connector 36 includes a ferrule 36a and an optical fiber 36b one end of which appears at one end of the ferrule 36a.

In the optical subassembly 24, the stem 24a, the lens holder 24b and the sleeve 24d may be made of metal. The optical subassembly 24 is provided on the board 22 in contact with the conductive pattern thereon. In a preferred embodiment, the optical device 24e may be a laser diode, and the electronic device 34 is a laser driver which generates a signal to drive a laser diode.

Subsequently, the heat spreaders 44 and 46 will be described in detail. As shown in FIGS. 1 and 2, the heat spreader 44 is in contact with the electronic device 34 and the cover 28. The heat spreader 44 has a pair of opposed surfaces 44a and 44b. One surface 44a can cover the area within which the electronic device 34 is mounted (for example, a rectangle 50 indicated by a broken line in FIG. 5). The first heat spreader 44 may be in contact with the top and side surfaces of the electronic device 34. The heat spreader 44 has side surfaces 44c to 44f, which can radiate the heat to the atmosphere. Moreover, the second heat spreader 46 is in contact with the optical subassembly 24 when the second heat spreader 46 is provided on the circuit board in contact with the cover 28. One surface 46a of the second heat spreader 46 has an area sufficient to be in contact with the conductive pin 24g of the optical subassembly 24 (for example, another rectangle 52 indicated by a broken line in FIG. 5). The other surface 46b of the second heat spreader is in contact with the cover 28. The second heat spreader 46 has side surfaces 46c to 46f, which can radiate the heat to the atmosphere.

Each of the heat spreaders 44 and 46 has a thickness approximately the same as or slightly larger than the distance between the circuit board 26 and the cover 28. Preferably, the heat spreaders 44 and 46 have elasticity sufficient to deform to be in contact with the surfaces of the electronic device 34, the optical subassembly 24 and the conductive pin 24g when the heat spreaders 44 and 46 are placed between the cover 28 and both electronic device 34 and optical subassembly 24, respectively.

Due to the above characteristics, the heat spreaders 44 and 46 have advantages as follows. Deformation of the heat spreaders 44 and 46 ensures that the heat spreaders 44 and 46 are in contact with the electronic device 34 and the optical subassembly 24, and provides the heat transfer parts 44 and 46 with larger contact surfaces that contacts with the electronic device 34 and the optical subassembly 24. Further, since the heat spreaders 44 and 46 can deform in accordance with the shapes of the electronic device 34 and the optical subassembly 24, it is not necessary to process the heat spreaders 44 and 46 into desired shapes. In addition, each of the heat spreaders 44 and 46 has an electrically insulative so that electrical isolation between the cover 28 and the optical subassembly 24 and conductive pattern on the circuit board 26 can be maintained.

The heat from the electronic device 34 and the optical subassembly 24 spreads in the heat spreaders 44 and 46. The contact area between the first heat spreader 44 and the cover 28 is larger than the contact area between the electronic device 34 and the first heat spreader 44. The contact area between the second heat spreader 46 and the cover 28 is larger than the contact area between the optical subassembly 24 and the second heat spreader 46. The heat can spread in the heat spreaders 44 and 46 and then be efficiently conducted to the cover 28 through the larger interfaces therebetween.

It is preferable that the heat spreaders 44 and 46 have adhesiveness, which makes it easier to maintain the contact between the heat spreaders 44 and 46 and the electronic device 34 and the optical subassembly 24.

Preferably, the heat spreaders 44 and 46 may have a thermal conductivity of 0.5 W/m/K or more, and 50 W/m/K or less. More preferably, the material of the heat spreaders 44 and 46 may have a thermal conductivity of 2 W/m/K or more and 20 W/m/K or less. Silicone gel may be used.

Preferably, the heat spreaders 44 and 46 may have hardness of 10 or more under the ASKER-C defined in the Society of Rubber Institute Standard (SRIS) 0101 and 100 or less. More preferably, the heat spreaders 44 and 46 may have hardness of 15 or more and 50 or less.

Referring to FIGS. 2 and 3, the optical subassembly 24 is located in the openings 26f and/or 22d, thereby reducing the height of the optical data link 10a and the length thereof measured along the predetermined direction.

Referring to FIG. 4, the circuit board 26 has the first and second surfaces 26f and 26g for mounting the electronic devices 33 to 35. The electronic devices 33 and 34 are mounted on the first surface 26f, and the electronic device 35 is mounted on the second surface 26g. The electronic devices 33 to 35 are electrically connected to the optical subassembly 24 or the conductive pins 22b through the conductive patterns on the circuit board 28.

As described above, the optical data link 10a has spaces provided on the top and bottom of the circuit board 26 for mounting the electronic components, thereby reducing the size of the circuit board.

Figure 5:
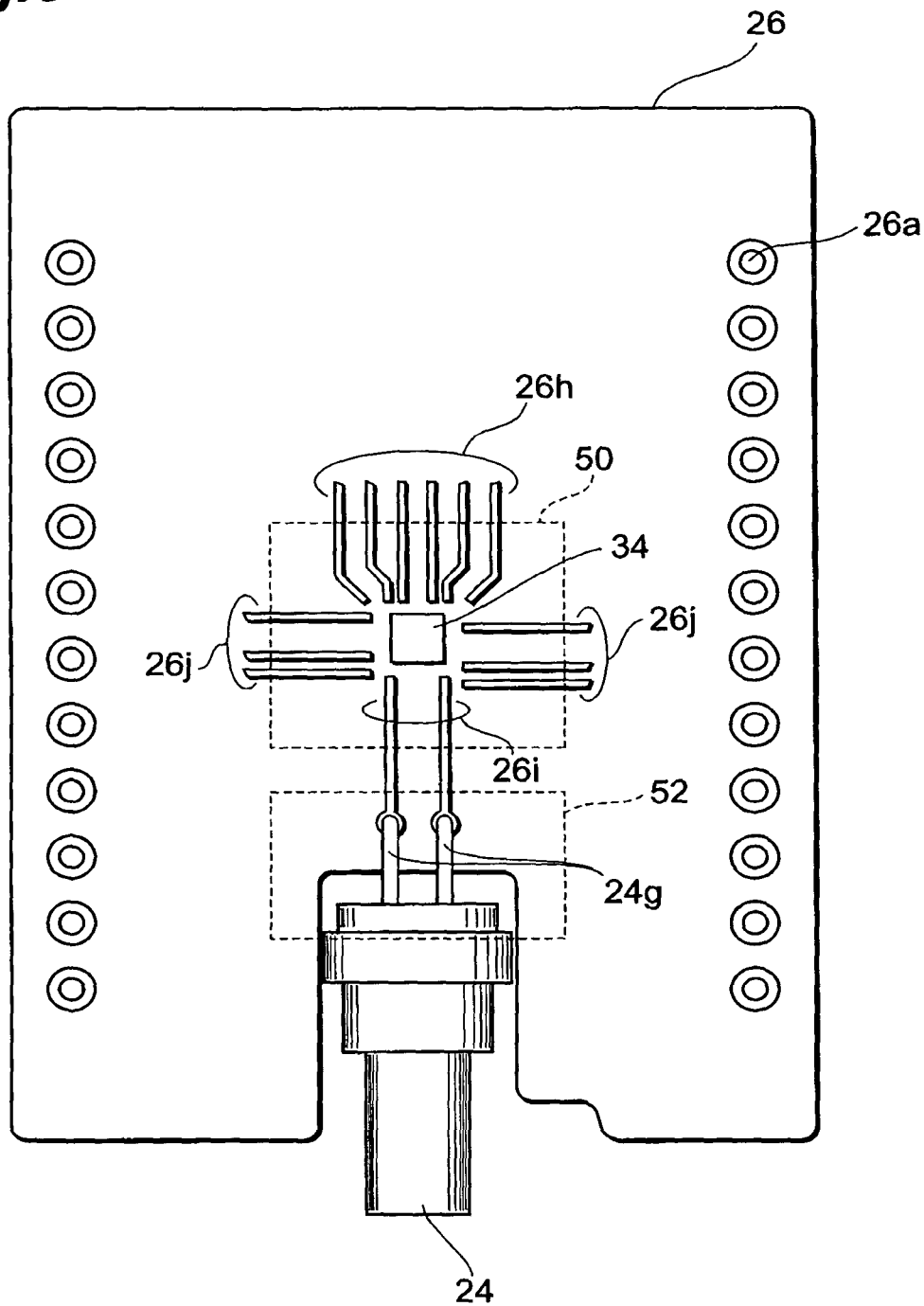
FIG. 5 is a plan view showing a circuit board for the optical data link.

FIG. 5 is a plan view showing the circuit board 26. The circuit board 26 has wiring patterns 26h, 26i and 26j. In FIG. 5, the heat spreaders 44 and 46 are located within regions indicated by broken lines 50 and 52. The first heat spreader 44 is positioned so as to contact with the wiring patters 26h, 26i and 26j connected to the electronic device 34 and covers the electronic device 34. The second heat spreader 46 is positioned so as to contact with the lead terminal 24g of the optical subassembly 24. Because of the contact with the wiring patterns 26h and 26j, the heat spreaders 44 and 46 receive the heat from the electronic device 34 through these conductive patterns. Additionally, the wiring patterns 26i are connected to the electronic device 34 and to the lead terminal 24g. Because of the contact with the wiring pattern 26i, the heat spreaders 44 and 46 receive heat from both optical subassembly 24 and electronic device 34 through the wiring pattern 26i. Hence, thermal interference is reduced between the optical subassembly 24 and the electronic device 34.

Figure 6A:
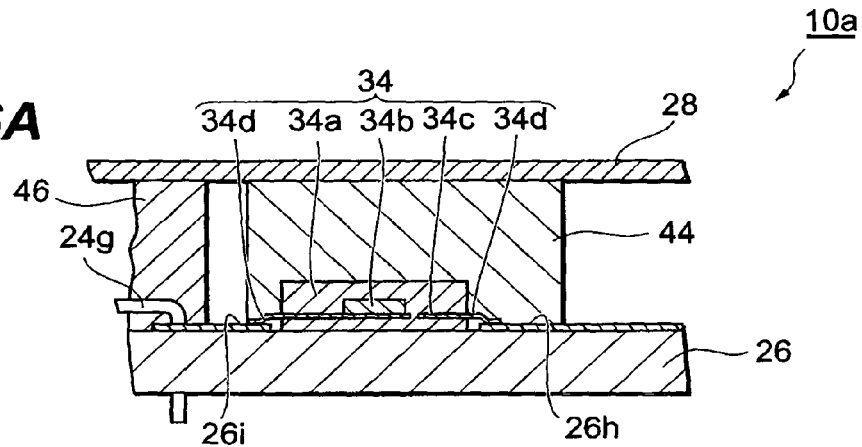
FIG. 6A is a cross sectional view of the optical data link taken along the line II—II shown in FIG. 1.

FIG. 6A is a cross sectional view of the optical data link taken along the line II—II shown in FIG. 1. The FIG. 6A shows one example of the electronic device 34. The electronic device 34 includes a sealing resin, a semiconductor device 34b such as a laser driver, and a lead frame 34c. The semiconductor device 34b is bonded on the lead frame 34c, and molded with the sealing resin 34a.

A part of the lead frame 34c extends through the sealing resin 34a to the external to form outer lead terminals 34d. The wiring patterns 26h and 26i are connected to the outer lead terminals 34d through solder.

The heat spreader 44 is deformed to be in contact with the surfaces of the sealing resin 34a, outer lead terminal 34d, conductive patterns 26i and 26h, and optical subassembly 24 (lead terminal 24g). Due to this deformation, depressions are formed in the first heat spreader 44 in accordance with the shapes of the conductive layer 26i and 26h, outer lead terminal 34d, and optical subassembly 24.

Figure 6B:
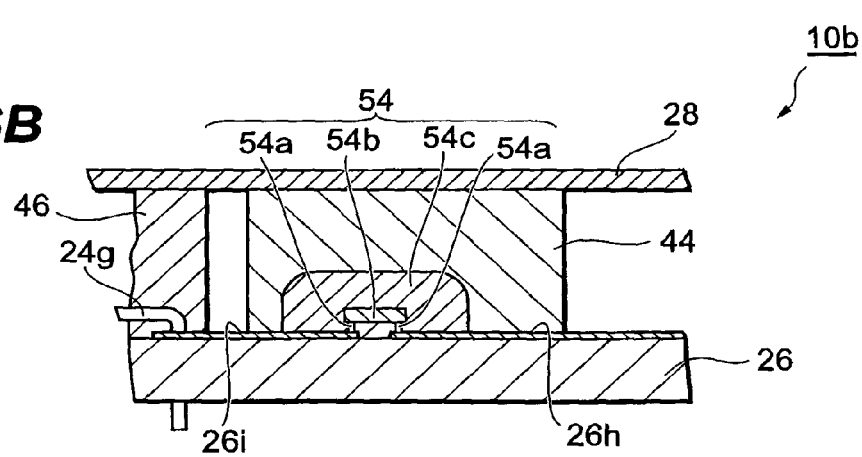
FIG. 6B is a cross sectional view of another optical data link taken along a line equivalent to the line II—II.

The FIG. 6B shows another example of the electronic device 54. The electronic device 54 has a bump 54a, provided on the wiring patterns 26h and 26i, a semiconductor device 54b provided on the electrodes 54a, and a sealing resin 54c which covers the semiconductor device 54b and the electrodes 54a. In this example, the semiconductor device 54b is mounted in a flip chip bonding method, and an electrode of the semiconductor device 54b is connected to the wiring patterns 26i and 26h through the bump 54a.

The first heat spreader 44 is deformed to be in contact with the surfaces of the sealing resin 54c and the conductive patterns 26i and 26h. The depressions are formed in the heat spreader 44 in accordance with the shapes of the conductive patterns 26h and 26j, and the sealing resin 54c. These depressions make it possible for the first heat spreader 44 to come into contact with all of the parts 54c, 26h and 26i.

Figure 6C:
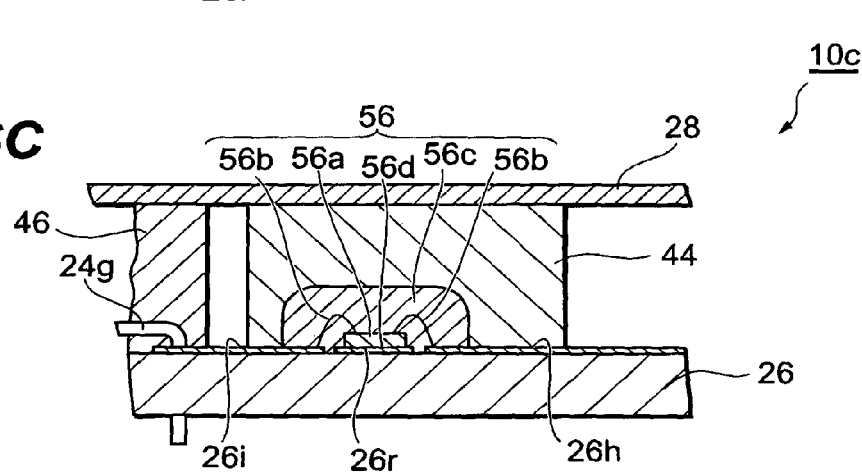
FIG. 6C is a cross sectional view of yet another optical data link taken along a line equivalent to the line II—II.

FIG. 6C shows still another example of the electronic device 56. The electronic device 56 has a semiconductor device 56a, a plurality of bonding wires 56b such as bonding wires, and a sealing resin 56c. The semiconductor device 56a is bonded on the circuit board 26. The bonding wires 56b connect the electrodes on the semiconductor device 56a with conductive patterns 26h and 26i. The sealing resin 56c seals the semiconductor device 56a and the bonding wires 56b. The semiconductor device 56a has a metal layer on the back surface thereof. This metal layer is bonded to another metal pattern 26r through a conductive adhesion 56d.

The first heat spreader 44 is deformed to be in contact with the surfaces of the sealing resin 56c and the conductive patterns 26i and 26h on the circuit board 26. Due to this deformation, depressions are formed in the first heat spreader 44 in accordance with to the shapes of the conductive patterns 26i and 26h and the sealing resin 56c. The depressions enable the heat spreader 44 to come to contact with all of the above parts 56c, 26i and 26h.

Figure 7:
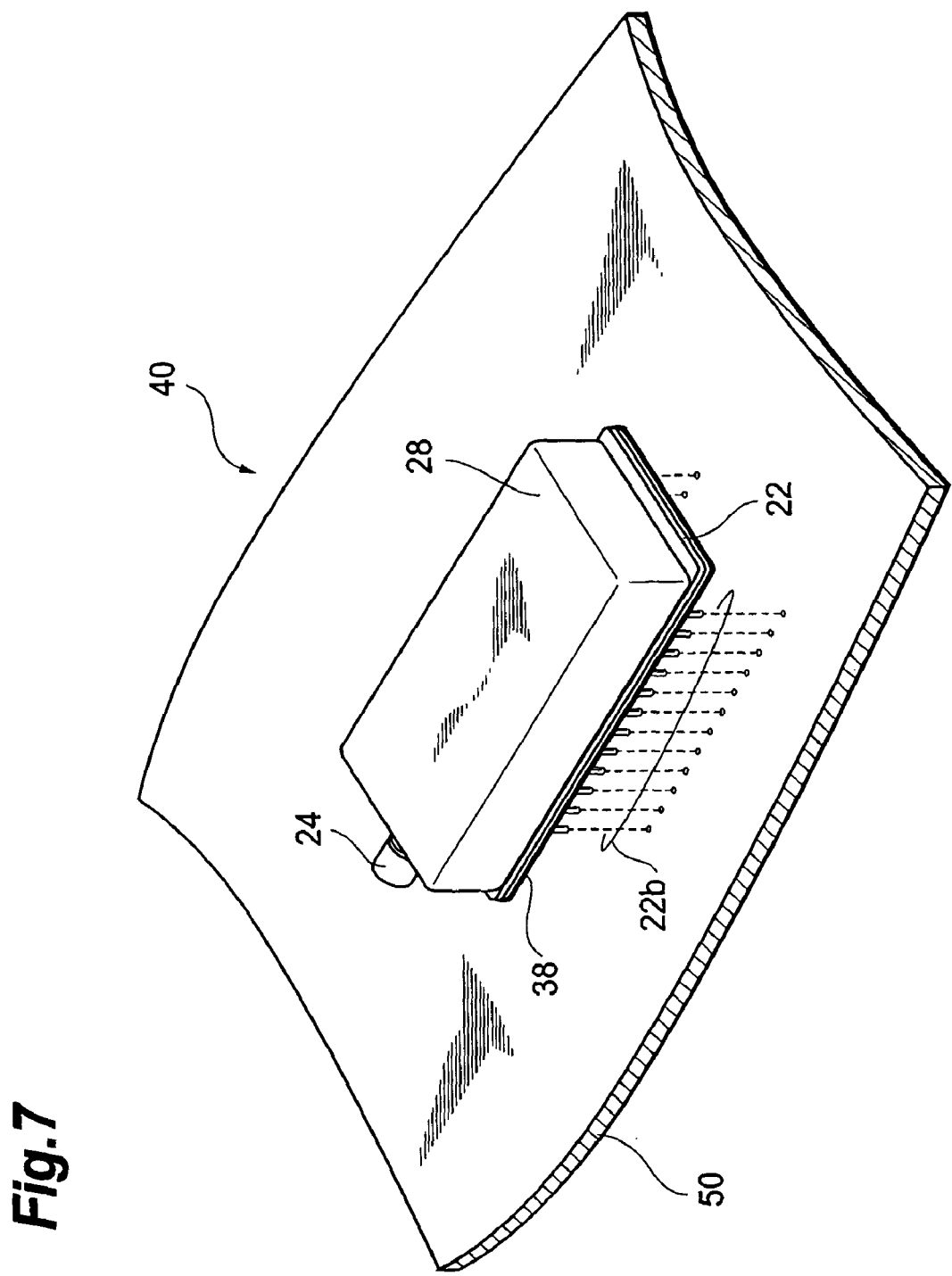
FIG. 7 is a view showing external appearance of the optical data link and a printed circuit board according to the embodiment.

FIG. 7 is a perspective view showing the optical data link 10a. Since the optical data link 10a is mounted on the printed circuit board 50, the heat is transferred to the base 22 and then is conducted to the printed circuit board 50. The optical data link 10a further includes an insulative sheet under the base 22.

(Second Embodiment)

Figure 8:
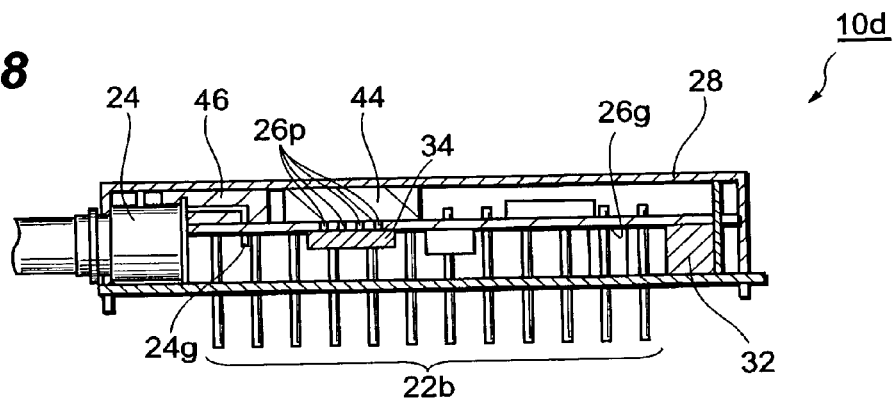
FIG. 8 is a cross sectional view showing the embodiment of the optical data link taken along a line equivalent to the line I—I shown in FIG. 1.

FIG. 8 shows another arrangement of an electronic device 34. The electronic device 34 is provided between a circuit board 26 and a base 22. The circuit board 26 includes a plurality of thermal vias 26p. The thermal vias 26p are conductors penetrating the circuit board, and in contact with the back surface of the electronic device 34. Meanwhile, a first heat spreader 44 is provided between the circuit board 26 and a cover 28, and is in contact with the cover 28 and the circuit board 26. Therefore, the heat from the electronic device 34 is transferred to the cover 28 through the thermal vias 26p and the first heat spreader 44, and dissipated from the cover 28 to the atmosphere.

It is preferable that the first heat spreader 44 has elasticity sufficient to deform to be in contact with the surfaces of the conductive pattern on the thermal vias 26*p* when placed between the cover 28 and the conductive pattern that is connected to the thermal vias 26*p*. In FIG. 8, the second heat spreader 46 is provided between the optical subassembly 24 and the cover 28.

Figure 9:
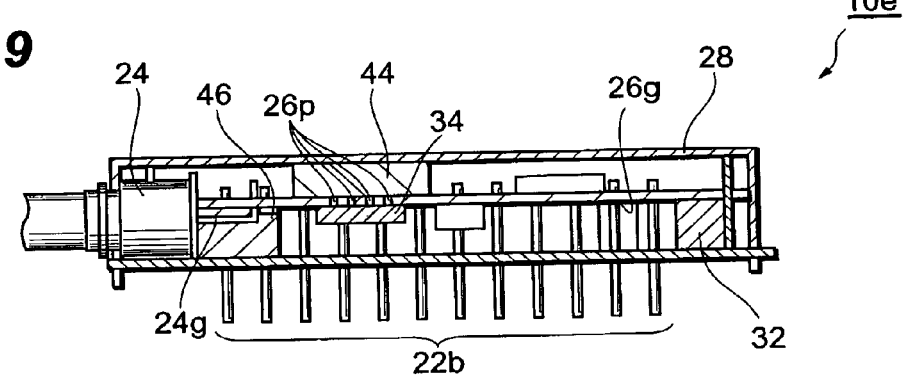
FIG. 9 is a cross sectional view showing a modified embodiment of the optical data link taken along a line equivalent to the line I—I shown in FIG. 1.

FIG. 9 is a view showing a modified embodiment. The second heat spreader 46 can be provided between the optical subassembly 24 and the base 22.

(Third Embodiment)

Figure 10:
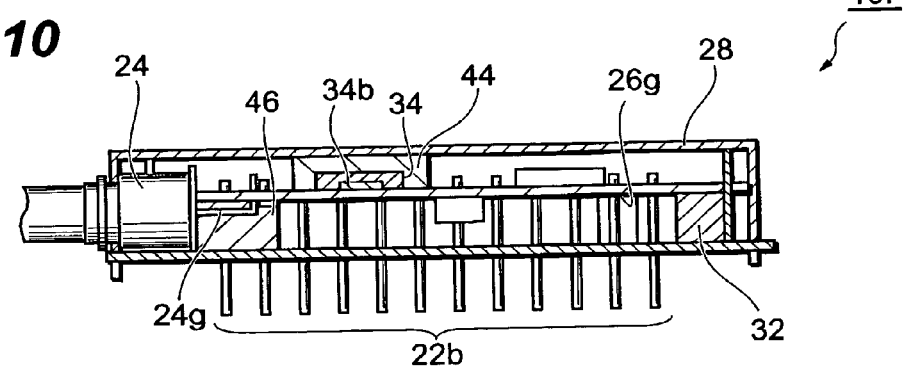
FIG. 10 is a cross sectional view showing a modified embodiment of the optical data link taken along a line equivalent to the line I—I shown in FIG. 1.

FIG. 10 is across sectional view of another embodiment of the optical data link. In an optical data link 10*f*, a first heat spreader 44 is provided between a circuit board 26 and the cover 28 so as to be in contact therewith. A second heat spreader 46 is provided between an optical subassembly 24 and a base 22 so as to be in contact therewith. In this embodiment, heat generated in the semiconductor element 34*b* is conducted to the cover 28 through the first heat spreader 44, whereas heat is generated in the optical subassembly 24 is conducted to the base 22 through the second heat spreader 46.

Figure 11:
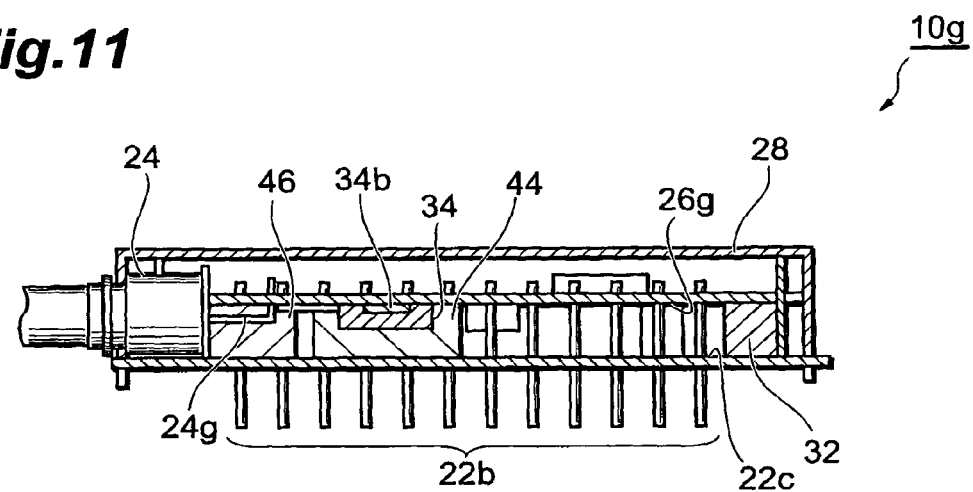
FIG. 11 is a cross sectional view showing a modified embodiment of the optical data link taken along a line equivalent to the line I—I shown in FIG. 1.

FIG. 11 is a cross sectional view of a modified arrangement of the heat spreaders 44 and 46. In the optical data link 10*g*, the first heat spreader 44 is provided between the circuit board 26 and the base 22 so as to be in contact therewith. The second heat spreader 46 is provided between the optical subassembly 24 and the base 22 so as to contact therewith. In this embodiment, the heat generated in the electronic device 34 and optical subassembly 24 is conducted to the base 22 through the heat spreaders 44 and 46.

Figure 12:
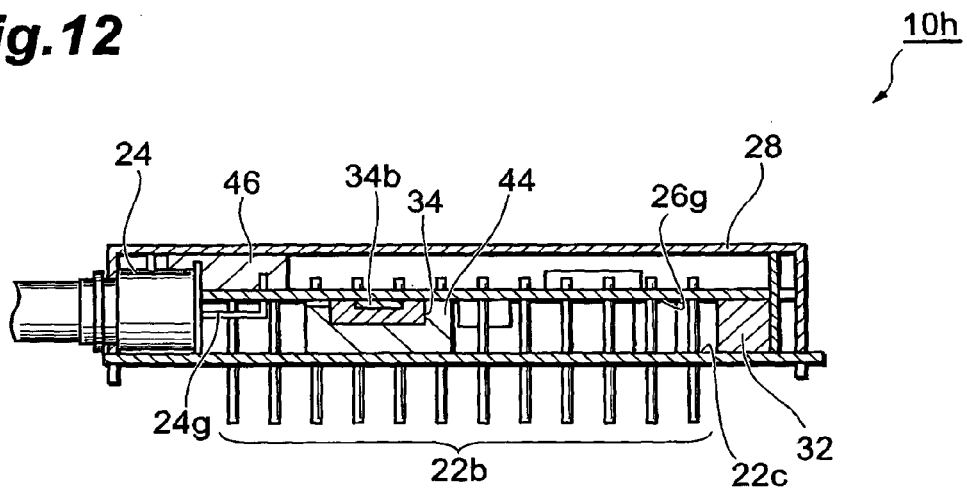
FIG. 12 is a cross sectional view showing a modified embodiment of the optical data link taken along a line equivalent to the line I—I shown in FIG. 1.

FIG. 12 is a cross sectional view showing yet another modified arrangement of the heat spreaders 44 and 46. In the optical data link 10*h*, the first heat spreader 44 is provided between the circuit board 26 and the base 22 so as to be in contact therewith. The second heat spreader 46 is provided between the optical subassembly 24 and the cover 28 so as to be in contact therewith. In this embodiment, the heat generated in the electronic device 34 is conducted to the base 22 through the first heat spreader 44, whereas the heat generated in the optical subassembly 24 is conducted to the cover 28 through the second heat spreader 46.

(Fourth Embodiment)

Figure 13A:
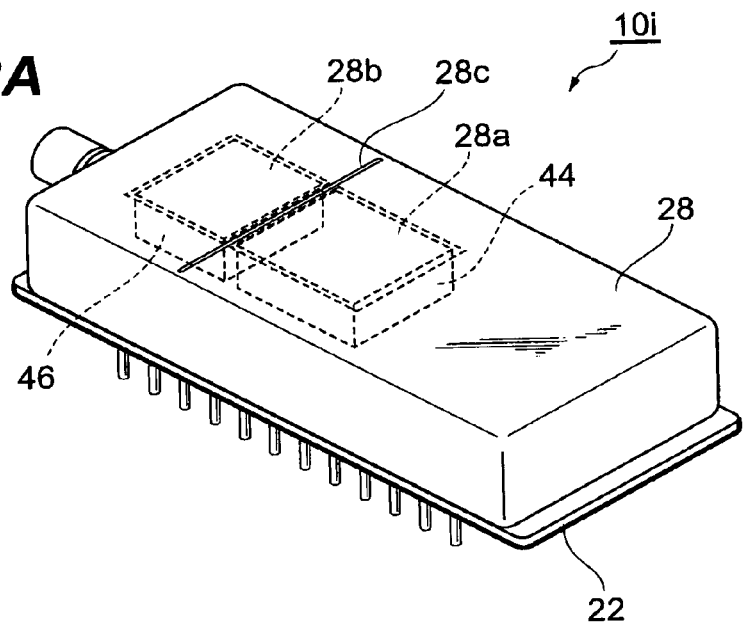
FIGS. 13A and 13B are perspective views showing a modified embodiment of the optical data link.
Figure 13B:
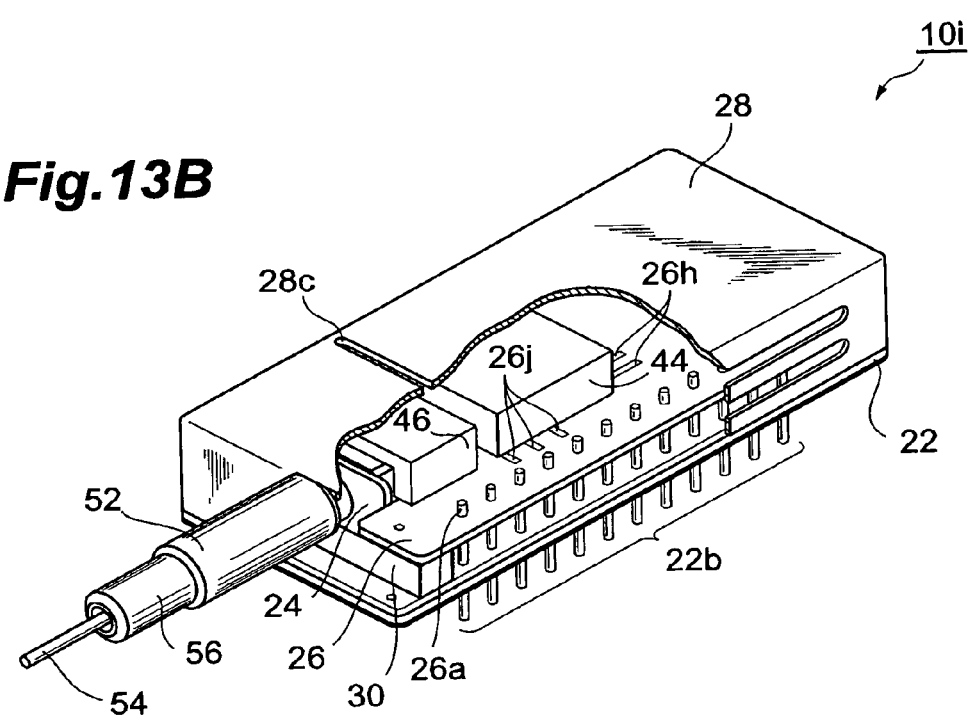

FIGS. 13A and 13B are perspective views showing the optical data link according to the embodiment. In an optical data link 10*i*, first and second heat spreaders 44 and 46 are in contact with first and second regions 28*a* and 28*b* of a cover 28, respectively. The cover 28 has a slit 28*c* provided between the first and second regions 28*a* and 28*b*. The slit 28*c* enhances thermal isolation between the first and second regions 28*a* and 28*b*.

(Fifth Embodiment)

Figure 14A:
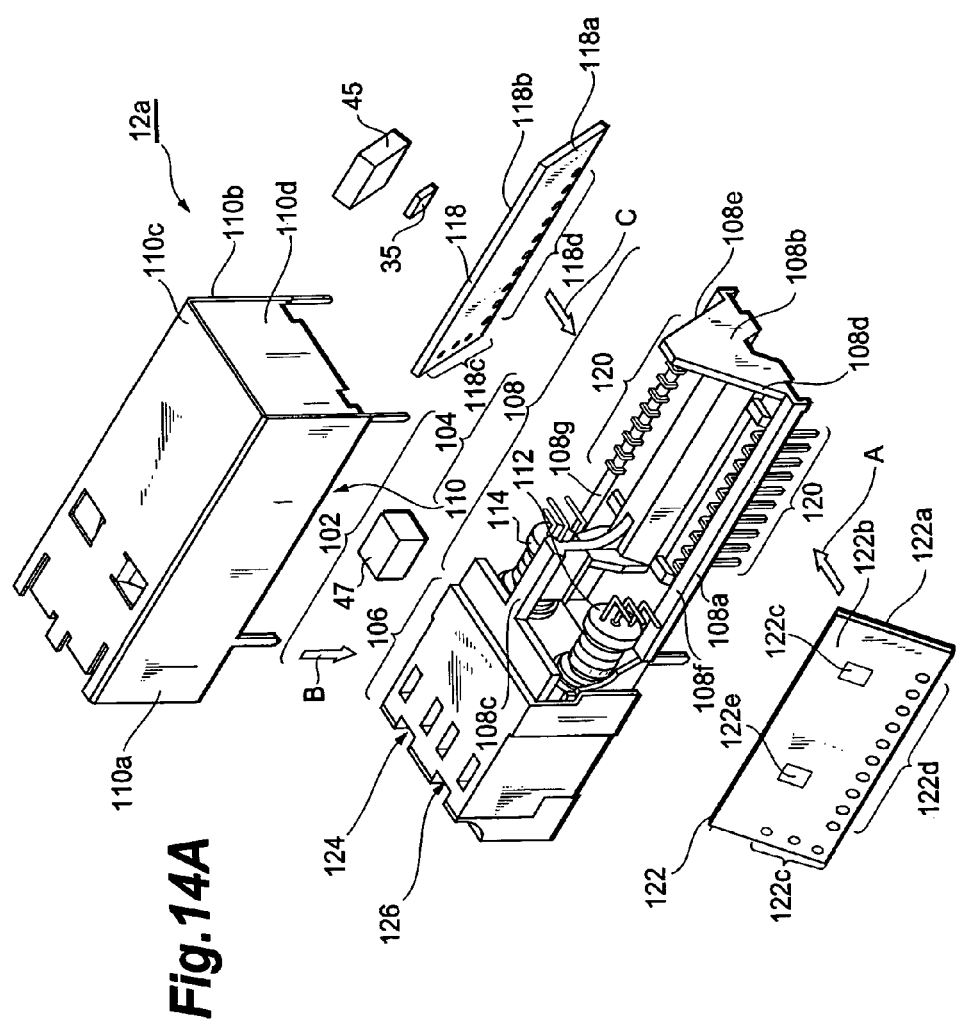
FIGS. 14A and 14B are views showing primary components of the optical data link.
Figure 14B:
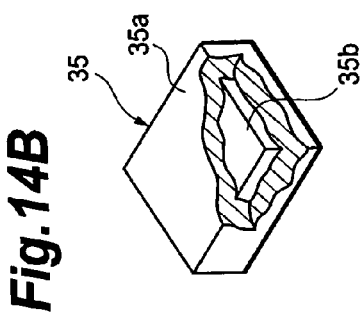
Figure 15A:
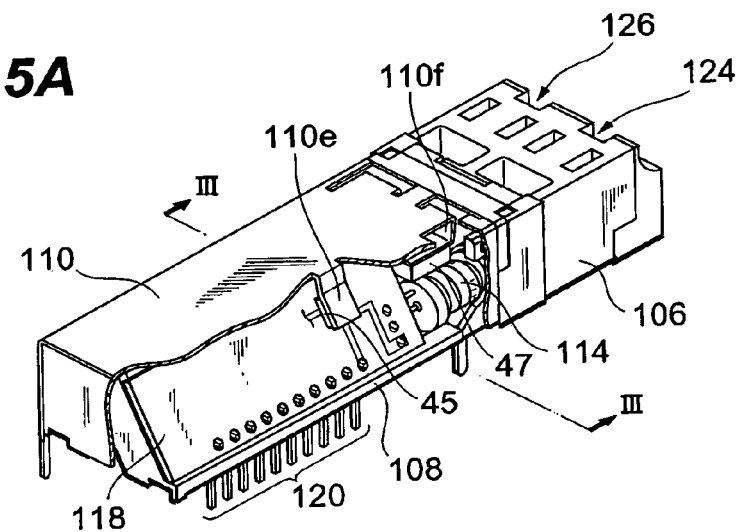
FIG. 15A is a cutaway view of the optical data link according to the embodiment.
Figure 15B:
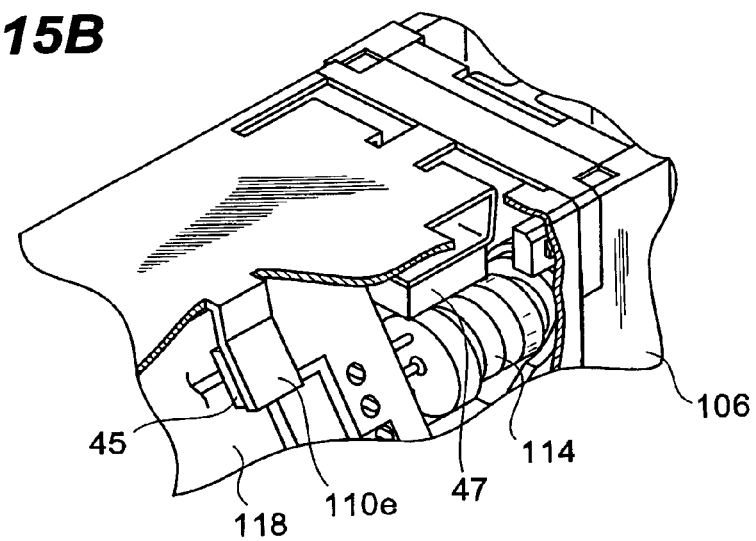
FIG. 15B is a enlarged view of the part of the optical data link.
Figure 16:
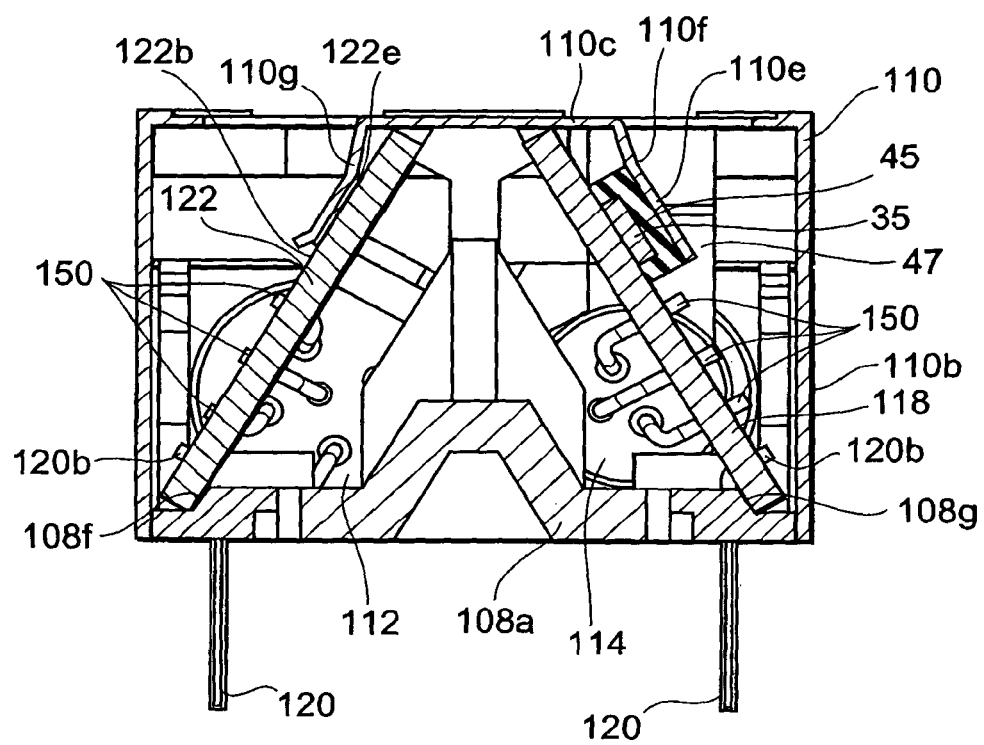
FIG. 16 is a cross sectional view showing the optical data link taken along the line III—III of FIG. 15A.

FIG. 14A is an exploded view showing components of the optical data link according to the fifth embodiment. FIG. 14B is a view showing a structure of an electronic device for the optical data link. FIG. 15A is a view showing the arrangement of a first heat spreader and a printed circuit board. FIG. 15B is a view showing the arrangement of a second heat spreader and an optical subassembly. FIG. 16 is a cross sectional view of the optical data link taken along the line III—III of FIG. 15A.

Referring to FIGS. 14A and 14B, an optical data link 12*a* includes a semiconductor device 35, a first heat spreader 45, a second heat spreader 47, a housing 102, a first optical subassembly 114, and a circuit board 118. The housing 102 has a container 104 and a receptacle 106. The container 104 has a base 108 and a cover 110, which support an optical subassembly 114. The base 108 mounts the circuit board 118. The cover 110 is located on the base 108 and the optical subassembly 114 and the circuit board 118 is provided therebetween.

An electronic device 35 includes the sealing resin 35*a* and the semiconductor element 35*b*, and is provided on the circuit board 118. The sealing resin 35*a* covers the semiconductor device 35*b* and has an electrically insulative. The optical subassembly 114 is mounted on the base 108 and includes a semiconductor optical device electrically connected to a conductive pattern on the circuit board 118. The first heat spreader 45 is provided between the housing 102 and the sealing resin 35*a* so as to be in contact therewith. The second heat spreader 47 is provided between the housing 102 and the optical subassembly 114 so as to be in contact therewith.

Heat from the semiconductor element 35*b* is conducted through the first heat spreader 45, and heat from the optical subassembly 114 is conducted through the second heat spreader 47. The first heat spreader 45 is located apart from the second heat spreader 47, thereby reducing thermal interference between the semiconductor device 35*a* and the optical subassembly 114. Preferably, the first and second heat spreaders 45 and 47 have characteristics similar to those of the first embodiment.

The base 108 has a plurality of lead terminals 120 such that they intersect with a reference plane. The circuit board 118 is provided along another reference plane. The other reference plane forms a predetermined angle with the reference plane.

With reference to FIGS. 15A, 15B and 16, the base 108 and the cover 110 forms a cavity in which the circuit board 118 is located. The cover 110 has a first finger 110*e* bent into the cavity so as to contact with the first heat spreader 45. The cover 110 also has a second finger 110*f* bent into the cavity so as to contact with the second heat spreader 47.

The first and second fingers 110*e* and 110*f* press the first and second heat spreaders 45 and 47 by their elastic forces, respectively. The elastic forces are useful in that it positions these heat spreaders; enhances the adhesion between the first heat spreader 45 and both of the sealing resin 35*a* and first finger 110*e*, and between the second heat spreader 47 and both of the optical subassembly 112 and second finger.

Referring back to FIGS. 14A and 14B, the optical data link 12*a* may further include another optical subassembly 112 and another printed circuit board 122. A body 104 supports the optical subassembly 112. The base 108 mounts the circuit board 122 for the optical subassembly 112. The optical subassembly 112 and the circuit board 122 are provided between the cover 110 and the base 108. A heat spreader maybe provided for each of the optical subassembly 112 and the circuit board 122 as is the case with the optical subassembly 114 and the circuit board 118. The receptacle 106 is provided with openings 124 and 126 in the front end thereof. These openings 124 and 126 receive an optical connector.

The cover 110 may be made of metal or have a conductive coating thereon for effectively shielding the optical subassemblies 112 and 114 as well as the circuit boards 118 and 122.

The cover 110 includes sidewalls 110*a* and 110*b*, a lid 110*c* and a rear wall 110*d*. The circuit boards 118 and 122 are located between the side walls 110*a* and 10*b*. The cover 110 is provided on the base 108.

As shown in FIG. 16, a finger 110*g* is provided in the lid 110*c* of the cover 110. The finger 110*g* is bent from the lid 110*c* into the cavity. Due to this bending, an opening is formed in the lid 110*c*. The finger 110*g* is in contact with the surface 122b. Because of this contact, the heat is conducted from the circuit board 122 to the cover 110. In order to enhance heat dissipation, the circuit board 122 has a metal pad 122e provided thereon. The cover 110 serves as a heat sink.

Figure 17:
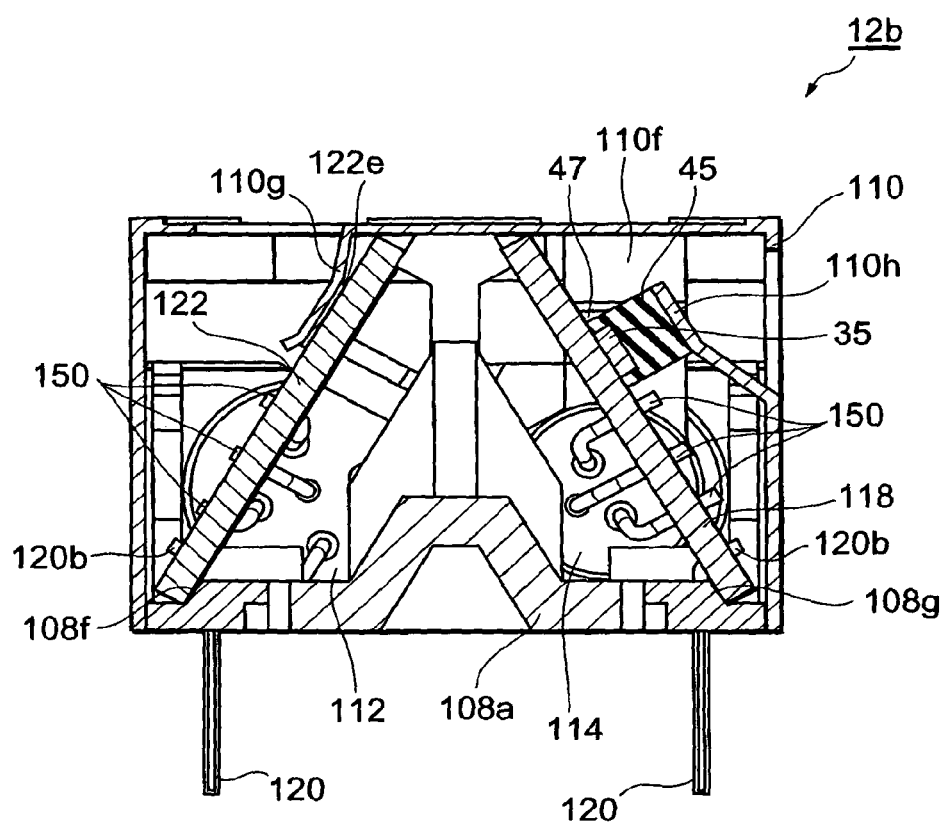
FIG. 17 is a cross sectional view showing a modified embodiment of the optical data link taken along the line III—III of FIG. 15A.

Alternatively, a finger 110h may be provided in the sidewall 110b, and a second finger 110f may be provided in the lid 110c as shown in FIG. 17.

Figure 18:
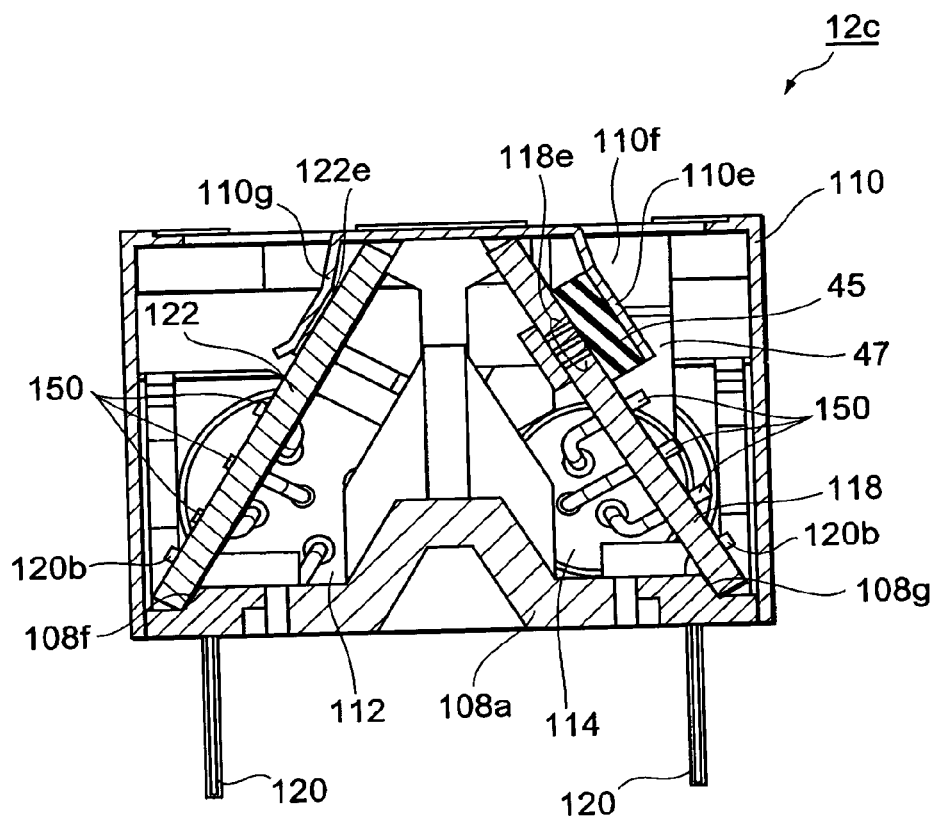
FIG. 18 is a cross sectional view showing a modified embodiment of the optical data link taken along the line III—III of FIG. 15A.

FIG. 18 is a view showing a modified arrangement of the optical data link. The circuit board 118 includes thermal vias 118e plugged with metal in the circuit board 118. The electronic device 35 is provided between the circuit board 118 and the base 108. Since the circuit board 118 has thermal vias 118e provided in a region below the electronic device 35, the heat from the electronic device is effectively conducted to the heat spreader 45. The first heat spreader 45 is located on the thermal vias 118e, but it is electrically insulated from the thermal vias 118e.

Figure 19A:
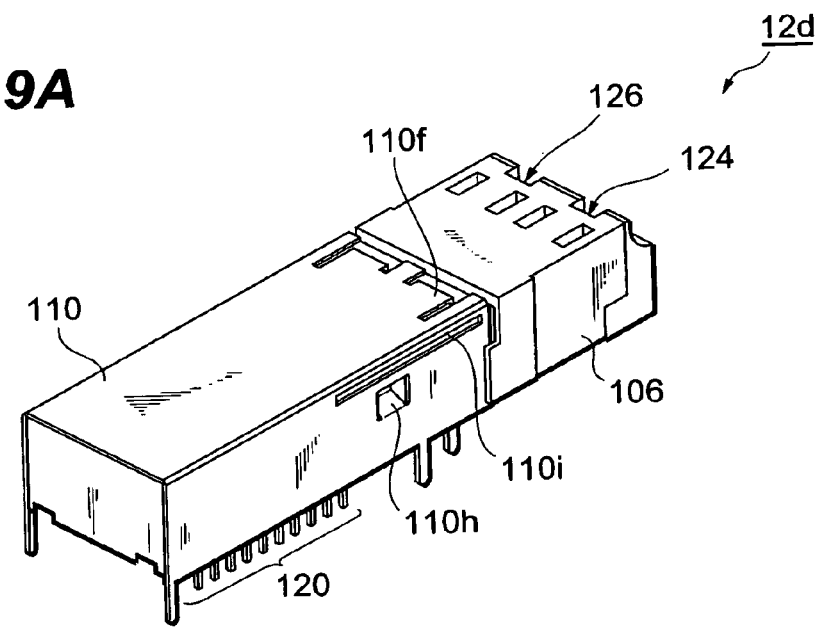
FIGS. 19A and 19B are views of modified embodiments of the optical data link.
Figure 19B:
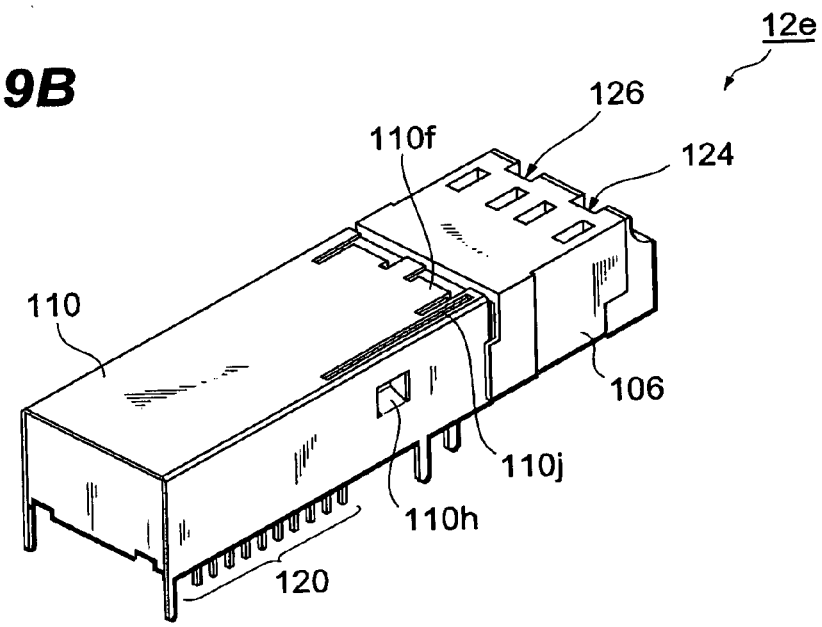

FIGS. 19A and 19B are views showing another modified arrangement of the cover 110. In FIG. 19A, the cover 110 has a slit 110i between the first and second fingers 110h and 10f. This slit 110i is provided in the side wall 110b. In FIG. 19B, the cover 110 has a slit 110j provided between the first and second fingers 110h and 110f. This slit 110j is provided in the lid 110c. Each of the slits 110i and 110j can enhance thermal resistance between the first and second fingers 110h and 110f. As shown in FIGS. 19A and 19B, the slits 110j and 110i extend along the edge of the lid 110c and the edge of the side wall 10b, respectively.

Figure 20:
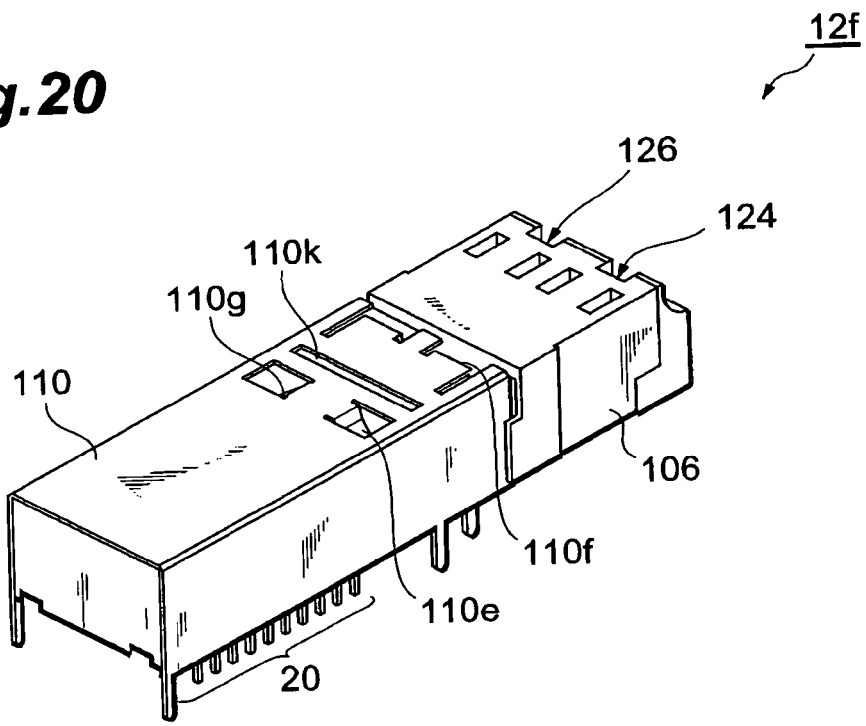
FIG. 20 is a perspective view showing another modified embodiment of the optical data link.

FIG. 20 is a view showing another arrangement of the optical data link. In the optical data link 12f, the cover 110 has a slit 110k provided between the first and second fingers 110e and 110f in the lid 110c, which extends in a direction from the boundary between the lid 110c the side wall 110b toward the boundary between the lid 110c and the side wall 110a.

Figure 21:
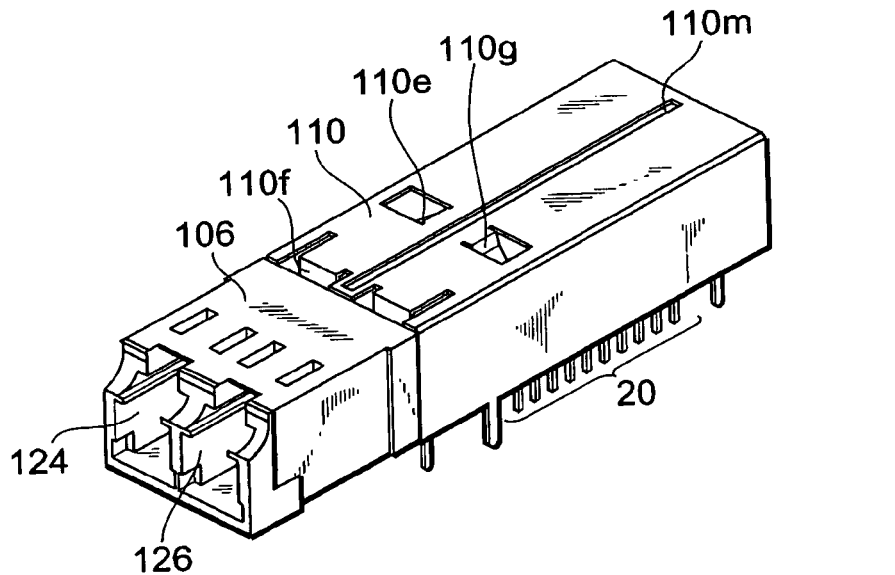
FIG. 21 is a perspective view showing yet another modified embodiment of the optical data link.

FIG. 21 is a view showing another arrangement of slit. In FIG. 21, the cover 110 has a third finger 110g, which extends into the cavity and may transfer the heat from the second circuit board 122 to the cover 110. The cover 110 has an opening 110m provided between the third finger 110g and both first and second fingers 110e and 110f. This opening 110m may enhance thermal resistance between the third finger 110g and both first and second fingers 110e and 10f.

Figure 22:
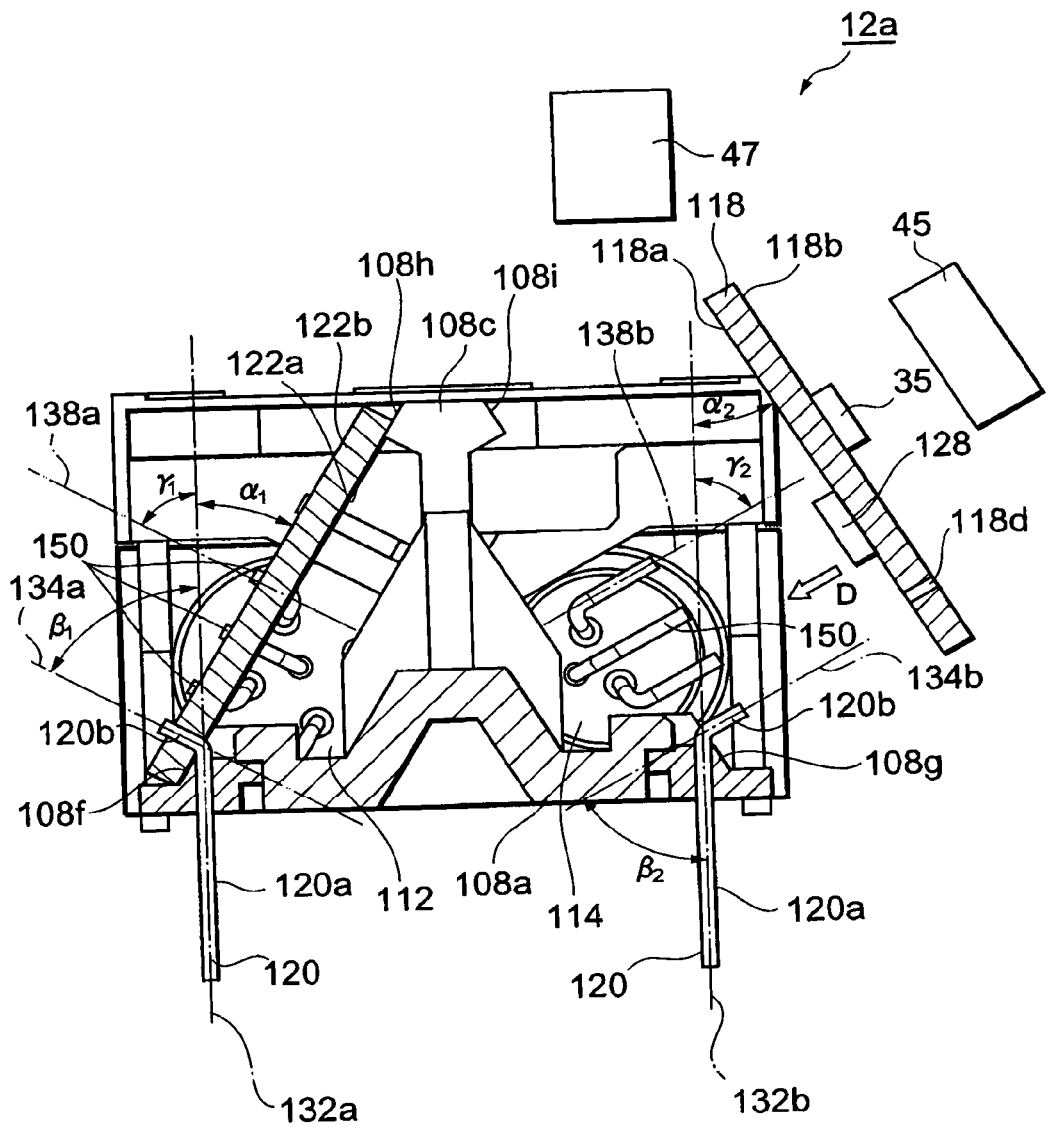
FIG. 22 is a cross sectional view showing the optical data link taken along the line III—III of FIG. 15A.

FIG. 22 is a cross sectional view taken along the line III—III of FIG. 15. The circuit board 118 has not been attached yet in FIG. 22. The base 108 has a rear wall 108b and a partition wall 108c provided on the bottom frame 108a. The bottom frame 108a forms a reference plane. The rear wall 108b is provided at the rear edge of the bottom frame 108a and intersects with the reference plane. The partition wall 108c locates on the substantially center of the bottom frame 108a.

The bottom frame 108a has a series of lead terminals 120 to be electrically connected with the optical subassemblies 112 and 114. The lead terminals 120 are provided on the bottom frame 108a which faces the mother board (reference numeral 50 in FIG. 7), and are bent. The lead terminals 120 are arrayed along both edges of the circuit boards 118 and 122.

The circuit boards 118 and 122 include mounting surfaces 118a and 122a and opposed surfaces 118b and 122b, respectively. Conductive patterns are provided on the mounting surfaces 118a and 122a for electrically connecting the mounted components to each other. Various electronic components or semiconductor devices are mounted on both of the mounting surfaces 118a and 122a and the opposed surfaces 118b and 122b.

As shown in FIG. 14A, the circuit board 118 and 122 include first holes 118c and 122c and second holes 118d and 122d. The lead terminals of the optical subassembly (reference numeral 24g in FIGS. 6A and 6B) are inserted into the first holes 118c and 122c, respectively. The lead terminals 120 are inserted into the second holes 118d and 122d.

Referring to FIG. 22, the circuit board 122 is inclined at an angle $\alpha_1$ with respect to a dashed line 132a orthogonal to the reference plane. The surface 122a of the circuit board 122 is supported by support surfaces 108f and 108h in the partition wall 108c and may be supported by a support surface 108d in the rear wall 108b. The angle $\alpha_1$ is larger than zero degree and smaller than 90 degrees. Each of the lead terminals 120 has a first portion 120a and a second portion 120b. The first portion 120a extends along a the dashed line 132a, and the second portion 120b is inclined at an angle $\beta_1$ with respect to the dashed line 132a. The optical subassembly 112 is oriented at an angle $\gamma_1$ so that the lead terminals 150 extend along a dashed line 138a. The angle $\gamma_1$ is substantially equal to the angle $\beta_1$.

As shown in FIG. 22, the lead terminals 150 of the optical subassembly 114 are oriented at an angle $\gamma_2$ in a direction of the dashed line 138b. Each of the lead terminals 120b is oriented at an angle $\beta_2$. When the circuit board 118 is moved along the arrow "D", the lead terminals 120b and the lead terminals 150 are inserted into the holes 118c and 118d, respectively. The surface 118a of the circuit board 118 is in contact with the support surfaces 108g and 108i, so that the circuit board 118 is positioned at an angle $\alpha_2$. The angle $\beta_2$ is substantially equal to the angle $\beta_2$. The angles of the circuit board 118 and 122 may be in a range of 10 to 80 degrees inclusive.

Figure 23A:
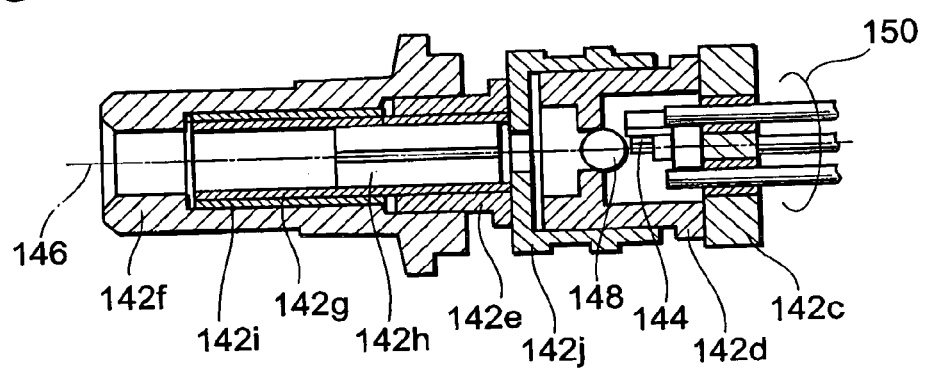
FIGS. 23A and 23B are views showing an optical subassembly.
Figure 23B:
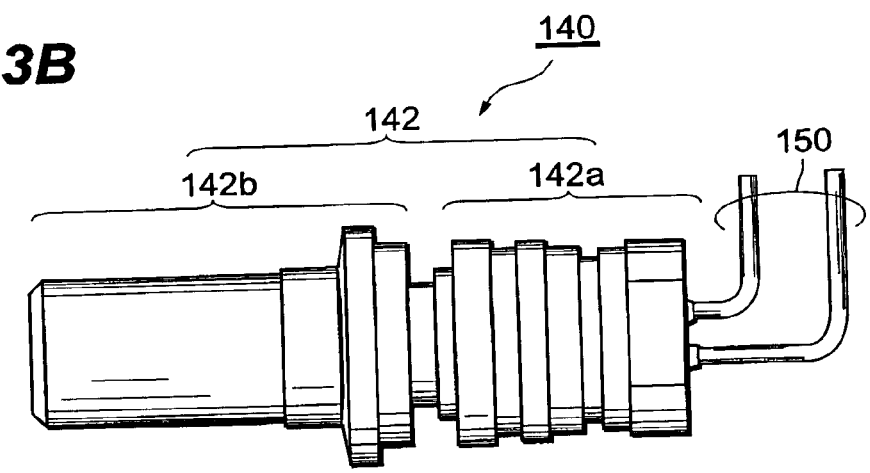

FIGS. 23A and 23B show the optical-to-electrical conversion device or the electrical-to-optical conversion device for the first and second optical subassemblies 112 and 114. A photodiode (a pin-type photodiode and an avalanche photodiode) maybe used as the optical-to-electrical conversion device 144. A light-emitting diode and a laser diode are used as the electrical-to-optical conversion device 144. The conversion device 144 can be enclosed in a package 142.

(Sixth Embodiment)

Figure 24A:
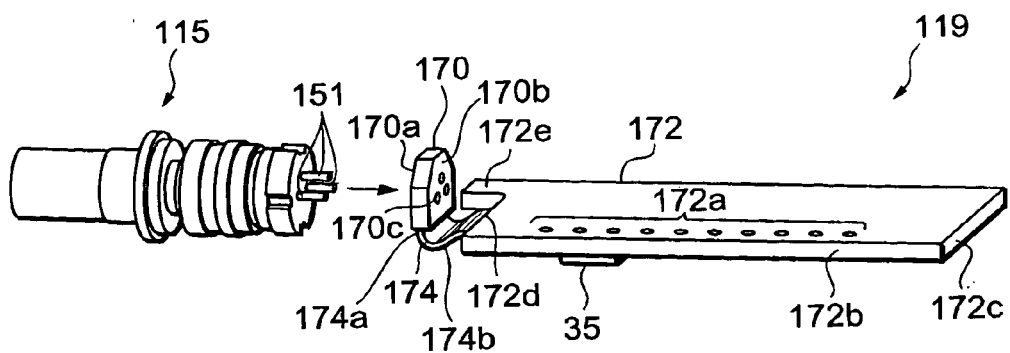
FIG. 24A is a view showing the optical subassembly and printed circuit board of the optical data link.
Figure 24B:
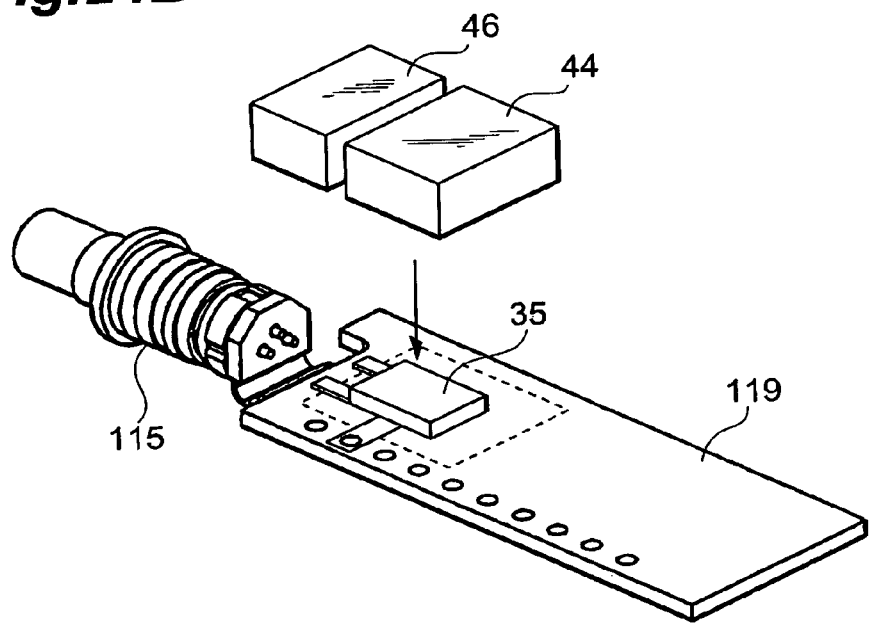
FIG. 24B is a view showing the printed circuit board, the optical subassembly and the heat spreaders.
Figure 25A:
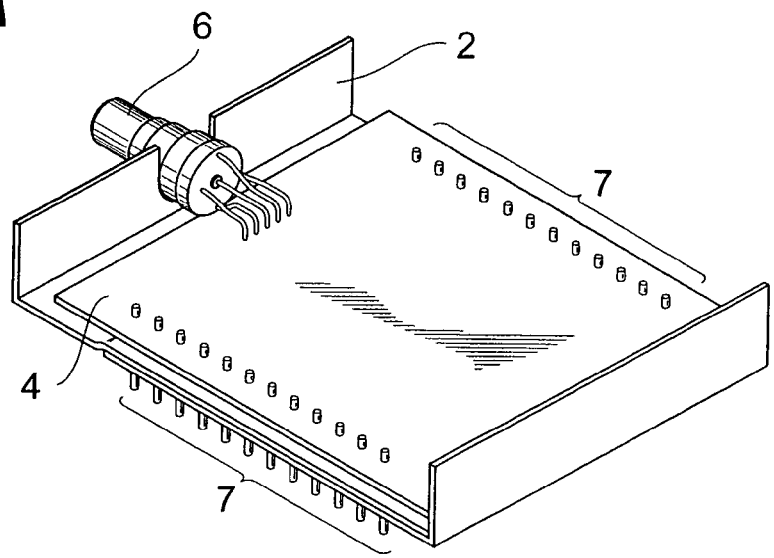
FIGS. 25A and 25B are views of a conventional optical data link.
Figure 25B:
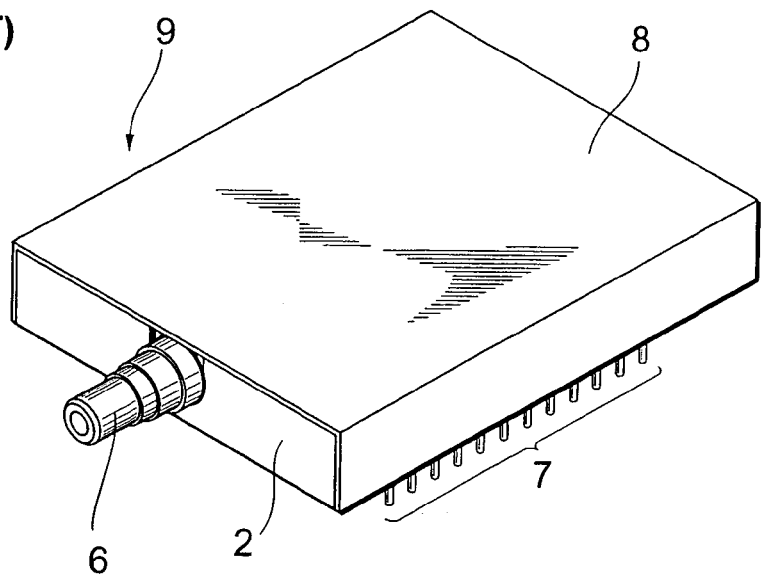
Figure 26A:
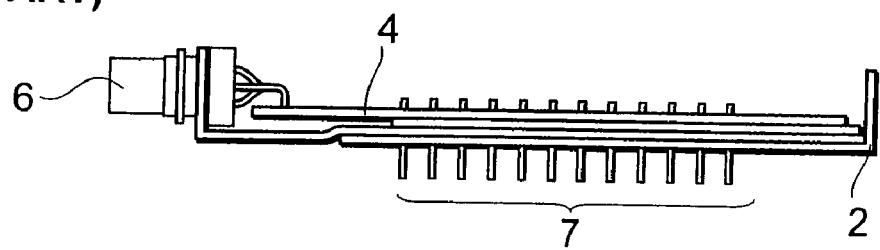
FIG. 26A is a view showing the conventional optical data link.
Figure 26B:
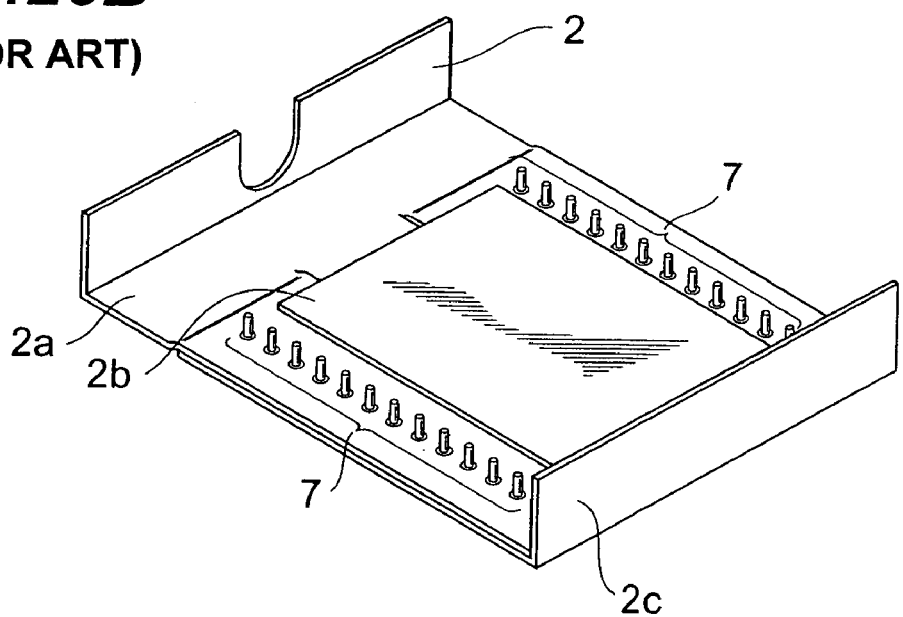
FIG. 26B is a view showing a sheet metal part for the optical data link.

In the optical data link of this embodiment, a board 119 such as a flexible printed circuit board can be used instead of the lead terminals of the optical subassemblies. FIG. 24A is a view showing an optical subassembly and the board. FIG. 24B is a view showing a heat spreader in addition to the board and the optical subassembly. The board 119 will be described herein below as an example, and the circuit board 122 can be replaced with a board similar to the board 119.

As shown in FIG. 24A, the board 119 has a connection board 170, a circuit board 172, and a flexible printed board 174. The connection board 170 is attached to the optical subassembly 115, and the circuit board 172 mounts an electronic device 35. The flexible printed circuit board 174 connects the circuit board 172 to the connecting board 170. The connection board 170 and the circuit board 172 are made of rigid boards.

The flexible printed circuit board 174 can loose the positions and/or angle of the optical subassembly 115 and the circuit board 172. For example, even when the optical subassembly 115 and/or the board 119 are deformed due to thermal expansion which may occur during the operation of the data link, the deformation of one of the members 115 and 119 does not displace the other.

The connection board 170 includes surfaces 170a and 170b opposing to each other, and through holes 170c connecting one of these surfaces to the other. Lead terminals 151 of the optical subassembly 115 are inserted into the through holes 170c. One end 174a of the flexible printed circuit board 174 is connected to one side of the connection board 170. The connecting board 170 is directly attached onto the stem of the optical subassembly 115, thereby shortening the length of lead terminal 151, which has undesired impedance.

The circuit board 172 mounts the electronic device 35. On the circuit board 172, holes 172a are arrayed along one edge 172b thereof. The lead terminals 120 of the base 108 are inserted into the holes 172a. The edge 172d is connected to the other end 174b of the flexible circuit printed board 174.

Referring to FIG. 24B, the heat spreader 44 can be located between the circuit board 119 and the cover 110, as is the case with the optical data link described above. The first heat spreader 44 is in contact with the electronic device 35, and the rigid circuit board 172 and the cover 110. The first heat spreader 44 may transfer heat from the electronic device 35 to the cover 110. In a preferred embodiment, the optical subassembly 115 is a light-transmission subassembly having a laser diode. The electronic device 35 may be a laser driver. Both laser driver and laser diode generate a large amount of heat during their operations. The laser driver consumes a greater power in comparison with the laser diode. By the heat spreaders 44 and 46, the temperatures of the laser diode and the laser driver does not so increase during the operations as the conventional optical data link.

The heat spreaders 44 and 46 are not in contact with the flexible printed board 174. In addition, since the thermal conductivity of the flexible printed board is smaller than that of the circuit board and the connection board, heat does not transfer between the circuit board and the connection board through the flexible printed board. Hence, thermal isolation between the semiconductor device and the optical subassembly is maintained.

According to the present invention, an optical data link which can reduce thermal interference between electronic parts is provided.

What is claimed is:

1. An optical data link comprising:
a housing;
a circuit board provided in the housing;
a semiconductor electrical device provided on the circuit board;
an electrically insulative member covering the semiconductor device;
an optical subassembly supported by the housing, the optical subassembly including a semiconductor optical device connected to the semiconductor electrical device through the circuit board;
a first heat spreader provided between the housing and the semiconductor electrical device, the first heat spreader being in contact with the housing; and
a second heat spreader provided between the housing and the optical subassembly, the second heat spreader being in contact with the housing and the optical subassembly,
wherein the second heat spreader is located apart from the first heat spreader.

2. The optical data link according to claim 1,
wherein the housing includes a base and a cover, the base supports the circuit board, and the circuit board is provided between the base and the cover,
wherein the semiconductor electrical device is provided between the circuit board and the cover,
wherein the first heat spreader is provided between the circuit board and the cover so as to be in contact with the cover and the insulative member, and
wherein the second heat spreader is provided between the optical subassembly and the cover so as to be in contact with the cover.

3. The optical data link according to claim 1,
wherein the housing includes a base and a cover, the base supports the circuit board, and the circuit board is provided between the base and the cover,
wherein the semiconductor device is provided between the circuit board and the base,
wherein the circuit board has a thermal via provided is in a predetermined region thereof and the semiconductor device is mounted on the predetermined region, and
wherein the first heat spreader is provided between the circuit board and the cover so as to be in contact with the cover and the thermal via.

4. The optical data link according to claim 1,
wherein the housing includes a base and a cover, the base supports the circuit board, and the circuit board is provided between the cover and the base,
wherein the semiconductor electrical device is provided between the circuit board and the cover,
wherein the first heat spreader is provided between the circuit board and the cover so as to be in contact with the cover and the insulative member, and
wherein the second heat spreader is provided between the optical subassembly and the base so as to be in contact with the base.

5. The optical data link according to claim 1,
wherein the housing includes a base and a cover, the base supports the circuit board, and the circuit board is provided between the base and the cover,
wherein the semiconductor electrical device is provided between the circuit board and the base,
wherein the first heat spreader is provided between the circuit board and the base so as to be in contact with the base and the insulative member, and
wherein the second heat spreader is provided between the optical subassembly and the cover so as to contact with the cover.

6. The optical data link according to claim 1,
wherein the housing includes a base and a cover, the base supports the circuit board, and the circuit board is provided between the base and the cover,
wherein the semiconductor electrical device is provided between the circuit board and the base,
wherein the first heat spreader is provided between the circuit board and the base so as to be in contact with the base and the insulative member, and
wherein the second heat spreader is provided between the optical subassembly and the base so as to be in contact with the base.

7. The optical data link according to claim 1,
wherein the first heat spreader is in contact with a first region of the cover,
wherein the second heat spreader is in contact with a second region of the cover, and
wherein the cover has an opening provided between the first and second regions.

8. The optical data link according to claim 2,
wherein the base and the cover form a cavity and the circuit board is provided in the cavity, and wherein the cover has first and second fingers, the first finger is bent into the cavity so as to be in contact with the first heat spreader, and the second finger is bent into the cavity so as to be in contact with the second heat spreader.

9. The optical data link according to claim 8,
wherein the cover has a side wall and a lid, and
wherein the first and second fingers are provided in at least one of the side wall and the lid.

10. The optical data link according to claim 8,
wherein the cover has an opening provided between the first and second fingers.

11. The optical data link according to claim 2,
wherein the base supports a plurality of lead terminals, and
wherein the circuit board makes an angle from 10 degrees to 80 degrees with respect to the base.

12. The optical data link according to claim 8, further comprising:
another optical subassembly provided in the housing;
another circuit board provided in the housing; and
an electronic component mounted on the other circuit board, the electronic component being electrically connected to the other optical subassembly, and
wherein the cover has a third finger bent into the cavity for transferring heat from the second circuit board, and
wherein the cover has an opening provided between the first and third fingers.

13. The optical data link according to claim 1,
wherein the circuit board includes a conductive pattern provided on a primary surface thereof,
wherein the conductive pattern is connected to the semiconductor device, and
wherein the first heat spreader is in contact with the conductive pattern.

14. The optical data link according to claim 1, further comprising:
a connection board connected with the optical subassembly; and
a flexible printed board connecting the circuit board with the connection board,
wherein the optical subassembly has a lead terminal connected to the connection board.

15. The optical data link according to claim 1,
wherein the first and second heat spreaders are electrically insulative.

16. The optical data link according to claim 1,
wherein at least one of the first and second heat spreaders have elasticity sufficient to deform in accordance with the shapes of the cover, the semiconductor electrical device and optical subassembly.

17. The optical data link according to claim 1,
wherein at least one of the first and second heat spreaders includes a silicone gel.

18. The optical data link according to claim 1,
wherein the semiconductor optical device contains a semiconductor light-emitting device driven by the semiconductor electrical device.

19. The optical data link according to claim 1,
wherein the first and second heat spreaders are made of material having a thermal conductivity of 0.5 to 50 W/m/K.

20. The optical data link according to claim 1,
wherein the first and second heat transfer are made of material having hardness of 10 to 100 under the ASKER-C defined in the Society of Rubber Institute Standard (SRIS) 0101.

* * * * *